US009017808B2

(12) United States Patent
Wang et al.

(10) Patent No.: US 9,017,808 B2
(45) Date of Patent: Apr. 28, 2015

(54) COMPOSITE THERMAL INTERFACE MATERIAL SYSTEM AND METHOD USING NANO-SCALE COMPONENTS

(75) Inventors: Hao Wang, Potomac, MD (US); Bahgat Sammakia, Binghamton, NY (US); Yayong Liu, Johnson City, NY (US); Kaikun Yang, Johnson City, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 1679 days.

(21) Appl. No.: 12/403,013

(22) Filed: Mar. 12, 2009

(65) Prior Publication Data
US 2009/0269604 A1 Oct. 29, 2009

Related U.S. Application Data

(60) Provisional application No. 61/037,125, filed on Mar. 17, 2008, provisional application No. 61/037,132, filed on Mar. 17, 2008.

(51) Int. Cl.
*B32B 5/16* (2006.01)
*H01L 23/12* (2006.01)
(Continued)

(52) U.S. Cl.
CPC ............ *H01L 23/373* (2013.01); *H01L 23/433* (2013.01); *H01L 2224/16* (2013.01); *H01L 2224/73253* (2013.01); *H01L 2924/01012* (2013.01); *H01L 2924/0102* (2013.01); *H01L 2924/01046* (2013.01); *H01L 2924/01078* (2013.01); *H01L 2924/16195* (2013.01);
(Continued)

(58) Field of Classification Search
USPC .................................. 428/323; 257/700, 701
See application file for complete search history.

(56) References Cited

U.S. PATENT DOCUMENTS 5,783,862 A * 7/1998 Deeney .......................... 257/714
7,144,624 B2 * 12/2006 Knowles et al. .............. 428/364
(Continued)

FOREIGN PATENT DOCUMENTS

WO WO2006132151 * 12/2006

OTHER PUBLICATIONS

Interface Material Selection and a Thermal Management Technique in Second-Generation Platforms Built on Intel® Centrino™ Mobile Technology, Intel Technology Journal, E.C. Samson et al., vol. 9, Issue 1, pp. 75-86, Feb. 2005.
(Continued)

*Primary Examiner* — Jennifer Chriss
*Assistant Examiner* — Camie Thompson
(74) *Attorney, Agent, or Firm* — Steven M. Hoffberg; Ostrolenk Faber LLP

(57) ABSTRACT

A method of manufacturing a thermal interface material, comprising providing a sheet comprising nano-scale fibers, the sheet having at least one exposed surface; and stabilizing the fibers with a stabilizing material disposed in at least a portion of a void space between the fibers in the sheet. The fibers may be CNT's or metallic nano-wires. Stabilizing may include infiltrating the fibers with a polymerizable material. The polymerizable material may be mixed with nano- or micro-particles. The composite system may include two films, with the fibers in between, to create a sandwich. Each capping film may include two sub films: a palladium film closer to the stabilizing material to improve adhesion; and a nano-particle film for contact with a device to be cooled or a heat sink.

29 Claims, 13 Drawing Sheets

(51) Int. Cl.
  *H05K 7/20* (2006.01)
  *B32B 3/26* (2006.01)
  *H01L 23/373* (2006.01)
  *H01L 23/433* (2006.01)
(52) U.S. Cl.
  CPC .... *H01L2924/01019* (2013.01); *Y10S 977/742* (2013.01); *Y10S 977/762* (2013.01)

(56) References Cited

U.S. PATENT DOCUMENTS

| | | | |
|---|---|---|---|
| 8,156,998 B2* | 4/2012 | Furman et al. | 165/80.3 |
| 2005/0228097 A1* | 10/2005 | Zhong | 524/430 |
| 2006/0234056 A1* | 10/2006 | Huang et al. | 428/408 |
| 2006/0258054 A1* | 11/2006 | Pan et al. | 438/122 |
| 2006/0279191 A1* | 12/2006 | Geohegan et al. | 313/309 |
| 2009/0115050 A1* | 5/2009 | Kasuya et al. | 257/701 |

OTHER PUBLICATIONS

S. Berber, Y. K. Kwon, and D. Tomanek, "Unusually high thermal conductivity of carbon nanotubes," Phys. Rev. Lett., vol. 84, pp. 4613-4617, 2000.

S. Maruyama, "A molecular dynamics simulation of heat conduction of a finite length single-walled carbon nanotube," Microsc. Thermophys. Eng., vol. 7, pp. 41-50, 2003.

W. Che, T. Cagin, and W. A. Goddard, "Thermal conductivity of carbon nanotubes," Nanotechnology, vol. 11, pp. 65-69, 2000.

P. Kim, L. Shi, A. Majumdar, and P. L. McEuen, "Thermal transport measurements of individual multiwalled nanotubes," Phys. Rev. Lett., vol. 87, No. 21, pp. 215502-1-215502-4, Nov. 2001.

S. U. S. Choi, Z. G. Zhang, W. Yu, F. E. Lockwood, and E. A. Grulke, "Anomalous thermal conductivity enhancement in nanotube suspensions," Appl. Phys. Lett., vol. 79, pp. 2252-2254, 2001.

M. J. Biercuk, M. C. Llaguno, M. Radosavljevic, J. K. Hyun, A. T. Johnsond, and J. E. Fischer, "Carbon nanotube composites for thermal management," Appl. Phys. Lett., vol. 80, pp. 2667-2769, 2002.

M. Moniruzzaman, K. I. Winey, "Polymer nanocomposites containing carbon nanotubes", Macromolecules, 39 (16): 5194-5205, 2006.

Q. Ngo, B. A. Gurden, A. M. Cassell, G. Sims, M. Meyyappan, J. Li, and C. Y. Yang, "Thermal interface properties of cu-filled vertically aligned carbon nanofiber arrays," Nano Lett., vol. 4, pp. 2403-2407, 2004.

J. Xu and T. S. Fisher, "Enhancement of thermal interface materials with carbon nanotube arrays," Int. J. Heat Mass Transf., vol. 49, pp. 1658-1666, 2006, ibid, "Enhancement of thermal contact conductance using carbon nanotube arrays," IEEE Trans.Comp. Packg. Tech. vol. 29, pp. 261-267, 2006.

H. Huang, C. Liu, Y. Wu, S. Fan, "Aligned carbon nanotube composite films for thermal management", Adv. Mater, 17, pp. 1652-1656, 2005, ibid, "Effects of surface metal layer on the thermal contact resistance of carbon nanotube arrays", Appl. Phys. Lett. 87, 213108, 2005.

Tian, Weixue; Yang, Ronggui, "Effect of interface scattering on phonon thermal conductivity percolation in random nanowire composites," 90 Applied Physics Letters 26: Art. No. 263105 Jun. 25, 2007.

Yang RG, Chen G, Dresselhaus MS, "Thermal conductivity of simple and tubular nanowire composites in the longitudinal direction", 72 Physical Review B 12: Art. No. 125418 Sep. 2005.

Z. F. Ren, Z. P. Huang, J. W. Xu, J. H. Wang, P. Bush, M. P. Siegal and P. N. Provincio, "Synthesis of large arrays of well-aligned carbon nanotubes on glass" 282 Science 1105 (1998).

Z.W. Pan, S. S. Xie, B. H. Chang, C.Y. Wang, L. Lu, W. Liu, W.Y. Zhou, W. Z. Li, and L. X. Qian, "Very long carbon nanotubes" 394 Nature 631 (1998).

Coquay, P., De Grave, E., Peigney, A., Vandenberghe, R. E. & Laurent, "C. Carbon nanotubes by a CVD method. Part I: Synthesis and characterization of the (Mg, Fe)O catalysts," 106 Journal of Physical Chemistry B 13186-13198 (2002)., ibid, "Carbon nanotubes by a CVD method. Part II: Formation of nanotubes from (Mg, Fe)O catalysts," 106 Journal of Physical Chemistry B 13199-13210 (2002).

Fischer JE, Zhou W, Vavro J, et al. "Magnetically aligned single wall carbon nanotube films: Preferred orientation and anisotropic transport properties," Journal of Applied Physics 93 (4): 2157-2163 Feb. 15, 2003.

Garcia EJ, Hart AJ, Wardle BL, Slocum AH, "Fabrication and nanocompression testing of aligned carbon-nanotube-polymer nanocomposites," 19(16) Advanced Materials 2151-+ Aug. 17, 2007.

Iijima S, "Helical microtubules of graphitic carbon", Nature, vol. 354, pp. 56-58, 1991.

Anand Desai, James Geer, and Bahgat Sammakia, "Models of Steady State Heat Conduction in Multiple Cylindrical Domains", Journal of Electronic Packaging, vol. 128, No. 1, pp. 10-17.

Anand Desai, Sanket Mahajan, Ganesh Subbarayan, Wayne Jones, James Geer, and Bahgat Sammakia, "A Numerical Study of Transport in a Thermal Interface Material Enhanced with Carbon Nanotubes,", Journal of Electronic Packaging, vol. 18, Mar. 2006.

INEMI Technology Roadmaps, Design Technologies, Jan. 2009.

* cited by examiner

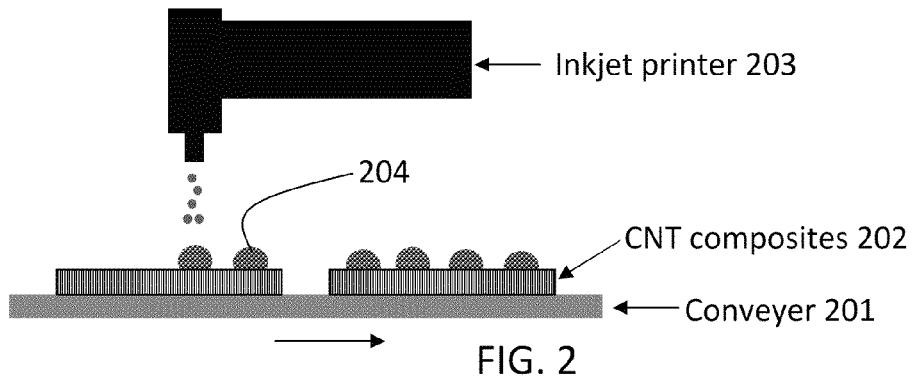
FIG. 2
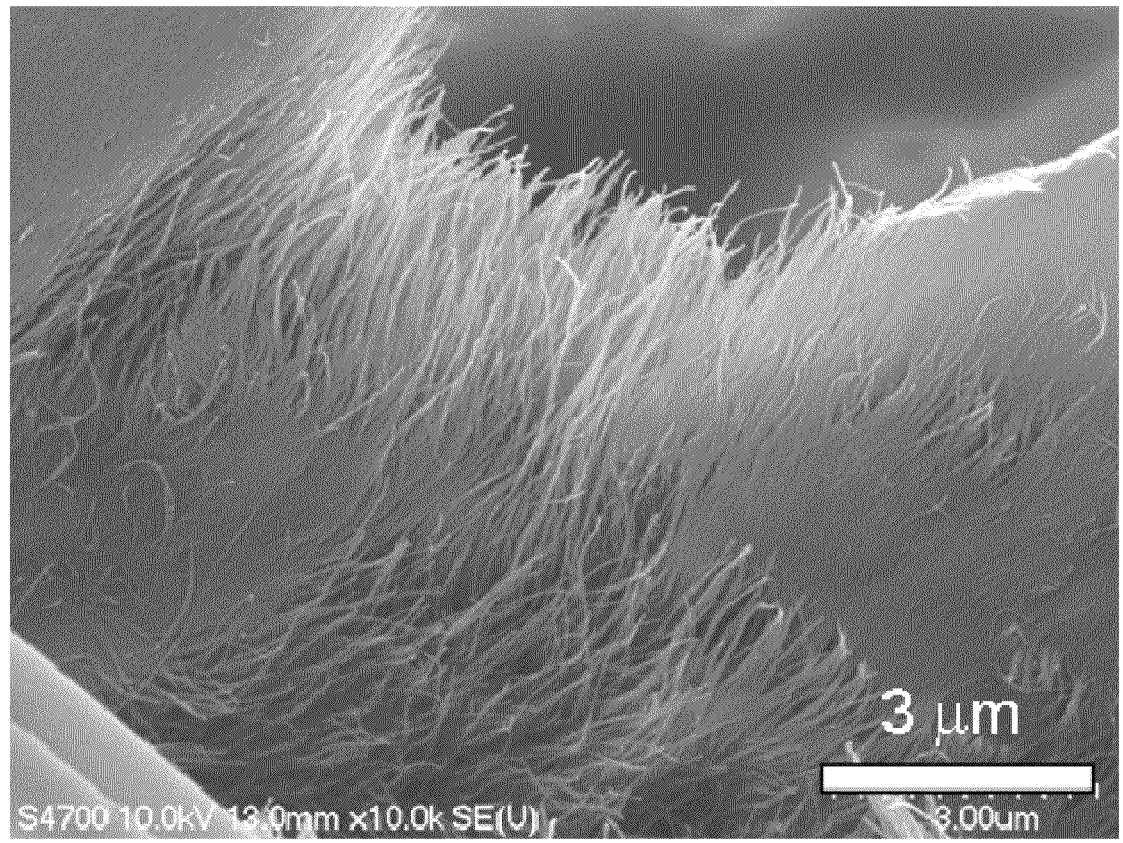
Fig. 3. Fracture morphology of VACNT/polymer composites showing embedded aligned CNTs

COMPOSITE THERMAL INTERFACE MATERIAL SYSTEM AND METHOD USING NANO-SCALE COMPONENTS

RELATED APPLICATION

The present application claims benefit of priority from U.S. Provisional Patent Application No. 61/037,125, filed Mar. 17, 2008, and from U.S. Provisional Patent Application No. 61/037,132, filed Mar. 17, 2008, each of which is expressly incorporated herein by reference in its entirety.

BACKGROUND OF THE INVENTION

1. Field of the Invention

The invention relates to the field of thermal interface materials (TIMs) for use in electronic devices or other thermal management applications that require rapid dissipation of heat. Examples of devices needing TIMs include computers, telecommunications, space, military, and medical apparatus.

2. Related Art

Power dissipation in electronic devices is projected to increase significantly over the next ten years to the range of 100-150 Watts per $cm^2$ for high performance applications[1]. This increase in power represents a major challenge to systems integration since the maximum device temperature needs to be around 100° C. An additional concern is that leakage currents may also significantly increase as the interconnect size continues to decrease into the nanometer realm. Leakage currents will increase the power dissipation levels well beyond the 150 W/$cm^2$ range. Thermal management is a major hurdle in the development of faster processors. In a typical chip heat sink assembly, the highest resistance to heat flow comes from the thermal interface material. Typically, the thermal conductivity of a thermal interface material ranges from 1-4 W/mK. One of the ways to increase thermal performance is to improve the thermal conductivity of the thermal interface material. Many concepts have emerged for increasing the thermal conductivity of thermal adhesives and pastes. A widely used approach is to add micron size, highly conductive filler particles in the matrix of the thermal interface material. Another alternative is to use carbon nanotubes. Nanotubes have unique properties as discussed by Iijima[20] and Berber et al.[3] have reported nanotubes have measured high electrical and thermal conductivities (around 6600 W/mK at room temperature) for carbon nanotubes. These can be placed in the thermal interface material to provide a low heat resistance path through the thermal interface material, significantly improving the thermal conductivity of the TIM. See, Doctoral Dissertation of Anand Hasmukh Desai "Thermal Management Of Small Scale Electronic Systems", Binghamton University, State University of New York, 2006, the entirety of which is expressly incorporated herein by reference.

Typical thermal interface materials used in production today include thermal greases and adhesives, thermal gels, phase change materials, and low melt point solders such as Indium[2]. The thermal conductivity for these materials ranges from about 3 (grease and adhesives) to 30 (solders) W/mK. The minimum required thickness of the thermal interface directly impacts the resistance, and varies considerably between these materials. For example, solder TIM solutions need to be considerably thicker than thermal grease due to thermo-mechanical issues.

Carbon nanotubes (CNTs) are promising new materials exhibiting extraordinary thermal properties, when grown on a device requiring a thermal interface. Theoretical calculations predict an unusually high value of phonon-dominated thermal conductivity at ca. 6600 W/m$K^{3,4}$, while experimental measurements on individual CNTs confirms a range of 3000-8000 W/(mK) at the room temperature[5,6]. While the exact values and their validation are still under debate, there is little doubt that the extremely high thermal conductivity of CNTs offers the possibility of using CNTs as TIM in electronics packaging to satisfy the increasing power dissipation challenge.

SUMMARY AND OBJECTS OF THE INVENTION

Challenges in designing a thermal interface material arise due to interfacial resistances, which are a function of surface conditions (devices and heat-sinks or heat spreaders), material properties of the TIM, and the assembly processes used to deposit the TIM and get it to the design point thickness. The interfaces are particularly problematic since they represent a transition between different materials and may contain air voids and other defects. Interfaces typically result in significant thermal resistances. A holistic system level optimization of the heat flow path between the device and the heat sink or heat spreader is desirable. The system level design should account for the thermal, mechanical and chemical properties of the TIM material, the mating surfaces and the effects of the assembly processes.

Prior concepts of using CNTs involve growing CNTs directly on a device to be cooled. This method tends to be cost-prohibitive.

Thermal interface materials are particularly vulnerable to damage under some application conditions because they may interface between materials with significantly different thermo mechanical properties such as coefficient of thermal expansion and modulus of elasticity. These differences in properties mean that during thermal cycles such as those that arise when a machine is turned on and off, the TIM is subjected to a mechanical load. In many applications, such cycles occur for thousands of times during the life of the product. The thermal interface material must be able to withstand such cycling without sustaining any significant damage.

Another issue to be addressed is the impact of the thermal interface material on overall system cost. While the cost of the interface material may be small, if it requires special assembly or handling processes that may slow down the overall assembly process then that may significantly impact the overall system cost.

Recent studies on both randomly filled CNT composites[7-9] and vertically aligned CNT (VACNT) arrays[10-12] have shown less than ideal characteristics. Typically, at most a few folds increase in thermal conductivity from that of the base materials has been observed. A problem has been the low conductance at filler/matrix and TIM/solids interfaces.

Additional issues in the use of CNTs as TIM's include:

Aligning the CNTs or other nano-scale fibers in the direction of transport. In the case of a microprocessor, for example, alignment is preferably perpendicular or near perpendicular to the microprocessor surface, so that the CNT's transport heat to the next level, namely a heat spreader or a heat sink;

Attachment between two surfaces to achieve heat transport between those surfaces, such that interfacial resistances between the CNT and the surfaces are acceptably small;

Attachment between the two surfaces, so as to allow relative movement between those surfaces—in order to absorb thermo mechanical displacements arising from either CTE differences or temperature differences; or any other mechanical movement that may arise in the application conditions;

Location of the active (thermally) CNT at hot spots on the device;

Low cost and high volume production, e.g. making the TIM independently manufacturable from the device and the heat spreader;

Capable of being readily assembled by a reasonably standard assembly process;

Robust and durable components that are not easily damaged during shipping, handling and assembly: This particularly applies to any thermal interface material that contains unprotected delicate structures such as nano- or micro-structures that are subject to damage; and Assembly processes that are reasonably manufacturable at an acceptable cost.

It would be desirable to create a new TIM that addresses some or all of the problems listed above.

It is especially desirable to manufacture a material in accordance with a method that includes stabilizing nano-scale fibers—prior to applying them to a device requiring a TIM—with a stabilizing material to create a stabilized fiber assembly. The stabilizing material may be a filler disposed amongst the nano-scale fibers. The stabilizing material may be a capping layer added to the fibers. There may be both stabilizing material and at least one capping layer. There may be two capping layers, creating a sandwich-like composite system. Each capping layer may be made of two (or more) sub-layers. Advantageously, the capping material may be a nano- or micro-particle paste that achieves the goals above of attaching the TIM, aligning the nano-scale fibers, and improving thermal conduction. The particles, in turn may be isotropic or anisotropic, and in the case of anisotropic particles, may be anisotropically aligned. Advantageously, the paste may be located adjacent to thermal hotspots in the material to be cooled, while voids in the paste, to improve processing, may be selectively located adjacent spots not expected to get so hot. Thus, for example, voids in the TIM may be statistically difficult to avoid, but may be selectively disposed in areas where they are tolerated. In some cases, a void may be desired, for example to help maintain a spatially uniform device temperature in spite of regionally varying heat dissipation.

The material thus manufactured is also advantageous—along with various embodiments and methods of manufacture. Other materials that might be used, analogously to CNTs, include silver or copper nanowires, carbon columns, and any fiber of a highly thermally conductive metal alloy.

It is also desirable for devices to be manufactured by adding the TIM after it is first assembled separately from the device requiring the thermal interface.

It is an object of the invention to provide a method of manufacturing a thermal interface material, comprising providing a sheet comprising nano-scale fibers, the sheet having at least one exposed surface; and stabilizing the fibers with a stabilizing material disposed in at least a portion of a void space between the fibers in the sheet. The detached sheet having stabilized fibers may be disposed between two layers of an assembly and is adapted to serve as a thermal interface material. The detached sheet having stabilized fibers may be compressed between the two layers of the assembly and heated. The fibers may be anisotropically aligned. The fibers may have axes which are selectively aligned in the direction of required thermal transport. The fibers may have axes which are substantially aligned normal to a plane of the sheet. The method may further comprise depositing a film on a surface of the sheet and/or removing a surface portion of the stabilizing material to expose an end portion of the fibers. For example, the method may comprise applying first and second nano- or micro-particle containing films on respective opposite surfaces of the sheet so that the stabilized fibers are sandwiched between the first and second films and/or applying a first and second nano- or micro-particle containing sub-film on a respective surface of the sheet. A sub-film adjacent to the fibers may comprise palladium.

The method may further comprise etching the stabilizing material on at least one surface to create at least one etched portion; and applying at least one respective metallic nano- or micro-particle film to at least one etched portion. The nano- or micro-particle film may comprise sinterable metallic particles coated with at least one sacrificial organic material as a shell; the method further comprising heating the film to disrupt the shell, and sintering the particles to form a substantially contiguous matrix. A pattern of the particle film may be selectively established, in which a first portion of the etched sheet is covered with the particle film and a second portion of the sheet is not covered with the particle film, the pattern being adapted to fill at least one expected gap between the thermal interface material and at least one solid surface.

The sheet may be selectively stabilized by differentially providing stabilizing material in different spatial portions of the sheet, and wherein a portion of the sheet with reduced stabilizing material is permeable to gasses.

The process for stabilizing may comprise infiltrating the fibers with polymerizable matrix material mixed with nano- or micro-particles; and polymerizing the polymerizable matrix material.

The stabilizing process may also comprise compressing the nano-scale fibers along at least one axis to selectively provide an oriented state in which the fibers are selectively oriented along at least one elongation axis; and adding at least one capping layer to retain the fibers in the oriented state.

The stabilizing material may be provided with a pattern of regularly distributed voids.

The stabilizing material may be selectively disposed on the sheet by a process comprising inkjet printing of polymerizable material and/or deposition of an aerosol of polymerizable material droplets. The stabilizing material may comprise micro or nanoparticles.

The stabilizing process may comprise subjecting the sheet to a vacuum; infiltrating the sheet with a polymerizable material; and releasing the vacuum, to thereby push shrink at least a portion of residual void spaces in the polymerizable material.

It is a further object to provide a method of manufacturing a device, comprising a) providing a thermal interface material comprising: i) a plurality of aligned nano-scale fibers grown separately from the device forming a sheet; and ii) at least one stabilizing material for stabilizing the fibers in a substantially aligned orientation parallel to a desired direction of heat transfer; and b) forming a thermally conductive interface between the thermal interface material and the device.

The thermal interface material may comprise at least one capping layer at a surface of the sheet, and the forming comprises causing the capping layer to conform to a shape of the device. The capping layer may comprise palladium. The fibers may comprise carbon nanotubes. Prior to forming, the ends of the substantially aligned nano-fibers on a surface of the sheet may be selectively exposed. The exposing may comprise selectively removing a portion of the stabilizing material on a surface of the sheet without degrading the ends of fibers within the removed portion of the stabilizing material. The stabilizing material may be removed by an ablation process.

The capping layer may also be a solder, e.g., a metallic or metalloid material that melts at a temperature below 450 C, and which, when melted, wets another metal surface to form a bond when cooled. Solders are typically metal alloys, often containing tin, copper, zinc, silver, bismuth, indium, antimony and lead as components. The solder may be provided as a plating, sinterable powder, or dip, and the solder may be provided on the surface to be soldered to the TIM. In some cases, a solder composition may be provided on each side of the TIM, and the solder composition may be the same or different on each, based, for example, on the respective melting points, and materials to be joined. In the case of an excess of solder, the TIM may be formed to provide flow channels to permit, under compression and heat, the excess solder to be removed from the interface. Preferably, these flow channels are disposed in areas with reduced need for heat transfer. The compression during heating permits the fibers extending from a surface of the TIM to pierce the solder, and make direct contact with the surface to be thermally interfaced. The solder, in turn, forms a bond with the TIM, holding it in position and conforming to the mating surface, and provides at least a modest degree of thermal transfer.

It is another object to provide a thermal interface material sheet, comprising a layer comprising anisotropically oriented thermally conductive nano-scale fibers, the sheet having at least one exposed surface; a stabilizing material disposed in at least a portion of a void space between the fibers in the layer; and a capping layer in direct contact with an end portion of the fibers proximate to an exposed surface of the sheet, the fibers extending beyond the stabilizing material and into the capping layer. The fibers may comprise carbon nanotubes, the stabilizing material may comprise an organic polymer, and the capping layer may comprise palladium.

Another object provides a thermal interface material comprising a plurality of nano-scale fibers having an anisotropic orientation, forming a self-supporting sheet; and a stabilizing material for retaining the fibers in their anisotropic orientation within the self-supporting sheet. The fibers may comprise carbon nanotubes, carbon columns, silver nanowires, copper nanowires, and/or a high thermal conductivity metal alloy.

The sheet may have first and second surfaces, each nano-scale fiber having respective first and second ends, the fibers being oriented such that a substantial fraction of the fibers have their respective first ends at the first surface and their second ends at the second surface, so that the fibers directly conduct heat between the first and second surfaces. At least one capping layer may be provided having a direct thermal interface with at least one of the first ends and the second ends of the fibers.

The stabilizing material may comprise a filler between the fibers. The stabilizing material may comprise a polymer, formed from a polymerizable material, such as a monomer, prepolymer, resin, or the like. The stabilizing material may comprise a polymerizable material and a concentration of nanoparticles of 20-60% by volume. The stabilizing material may comprise metallic micro- or nano-particles. The stabilizing material may comprise nano- or micro-particles having a thermal conductivity greater than a bulk material of the stabilizing material.

The material may further comprise at least one capping layer disposed on a surface of the sheet, at least a portion of the fibers terminating within the capping layer. The capping layer may comprise metallic microparticles which are at least 1 micron in size The thermal interface material may be adapted to reduce mechanical stresses that arise between devices coupled by the thermal interface material as compared to a direct bonding of surfaces of the devices. The thermal interface material may also be adapted to reduce a stress between devices cause by at least one of differences in coefficient of thermal expansion, or differences in temperature.

The material as provided may comprise areas having low modulus of elasticity, whereby stresses in an assembly composed of a device, a heat sink, and the thermal interface material disposed between respective surfaces of the device and the heat sink, are reduced.

The material may be provided in conjunction with a device or between a pair of devices, each having a surface, wherein the material is selectively bonded to one or both surfaces to provide bonded portions and unbounded portions.

The material may be provided such that the stabilization material has a lower modulus of elasticity than the fibers; and at least one of fibers and stabilization material are configured to be selectively disposed at defined hot spots on a device to be cooled, with at least some gaps elsewhere, whereby stresses are reduced.

It is another object to provide a method of forming a thermal interface material comprising a plurality of nano-scale fibers having an anisotropic orientation, forming a self-supporting sheet, and a stabilizing material for retaining the fibers in their anisotropic orientation within the self-supporting sheet, comprising the steps of providing a mat of nano-scale fibers; applying a stabilizing material precursor to the mat; subjecting the mat and stabilizing material to temperature and pressure conditions sufficient to produce the stabilizing material and the sheet; removing a portion of the stabilizing material on at least one surface of the sheet while preserving protruding free ends of the nano-scale fibers; and capping the free ends of the nano-scale fibers to provide a direct thermal interface therewith. The sheet is preferably placed between two surfaces, to thereby conduct heat therebetween.

Further objects, advantages, and embodiments will be apparent in the following.

BRIEF DESCRIPTION OF THE FIGURES

The invention will now be described with reference to the following figures, which constitute non-limiting examples:

FIG. 2 shows assembly of a device in accordance with the invention;

FIG. 3 shows VACNT fibers;

DETAILED DESCRIPTION OF THE PREFERRED EMBODIMENTS

For the purposes of this application the terms "nanometer realm" or "nano-scale" are understood to mean approximately 1-100 nm, and preferably 1-10 nm. "Nano-particles" will be in this same size range. Micro range will be understood to mean about 0.1 to about 10 microns.

Figure 1A:
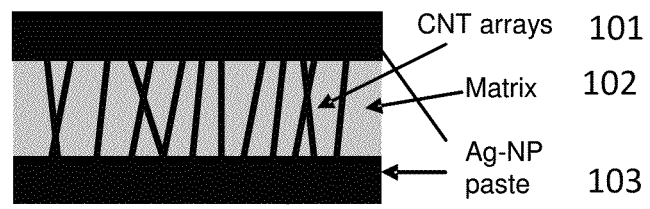
FIG. 1A is a schematic of a TIM in accordance with the invention.

FIG. 1A is a schematic diagram of a TIM system in accordance with the invention. FIG. 1A illustrates nano-scale fibers 101, such as CNT's stabilized in a matrix 102 and sandwiched between two capping layers 103, such as silver nanoparticle paste. The fibers 101 may be vertically aligned or randomly oriented. There will be some expense associated with getting the fibers to be aligned, but aligned fibers are expected to demonstrate superior performance, and are therefore preferred. On the other hand, even in an unaligned state, a portion of the fibers 101 will be oriented normal to the interface plane. The matrix 102 may include organic or organic/inorganic hybrid material stabilizing the arrays or networks of nano-scale fibers 101. The fibers 101 function as heat-passages for heat flux.

Other materials that might be used as fibers 101, analogously to CNTs, include silver or copper nanowires, carbon columns, and any other highly thermally conductive fiber, for example formed of metal alloys or organic or mineral materials.

Figure 4:
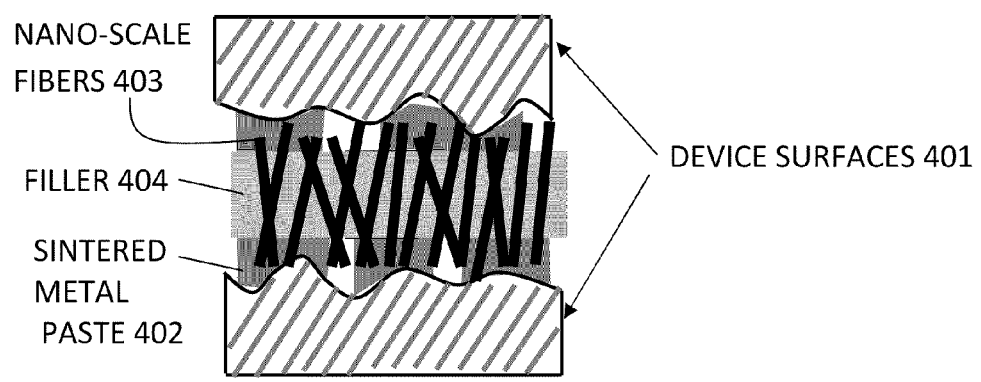
FIG. 4 shows a TIM in accordance with the invention sintered between two device surfaces.

To achieve high bulk thermal conductivity, the fibers 101 preferably physically connect the two opposing solid surfaces 401 (shown in FIG. 4). Any low conducting interfaces could be detrimental to overall performance. This preference for physical connection holds true no matter whether the fillers in use contain nanoparticles (NPs) or microparticles, or whether the fibers are nanowires (NWs), or nanotubes. Examples of thermal properties of nanowires are discussed in several papers[13,14]. However, at the interfaces between the TIM and solids (such as a die or a heat sink), direct contacts between the nano-scale fibers and solids direct connection is desirable but generally impossible to realize, except perhaps if the fibers are grown between the surfaces, in which case the density of fibers may be too low. Therefore, an approximation of physical contact, which achieves thermal performance approaching that of true physical contact, is preferred.

A deformable buffer layer 103 with good interfacial adhesion with both fibers 101 and the solid surface 401 (shown in FIG. 4) is therefore provided. Fibers 101 are embedded between capping layers 103. The capping layers 103 wet the solid surfaces, potentially eliminating voids due to surface roughness. The capping layers 103 also may serve to improve mechanical strength of the TIM, making it more suitable for automatic processing, including being punched out and/or being picked up, carried, or placed, during device assembly. The capping layers 103 may also further serve a lateral heat dissipation function, perpendicular to the direction of heat transport provided by the fibers 101.

The matrix 102 may be, for example, a polymer with included nano- or micro-particles.

The assembly shown in FIG. 1A will generally have a thickness in the range of 2 to 1000 microns, preferably in the 100 to 150 micron range.

Figure 1B:
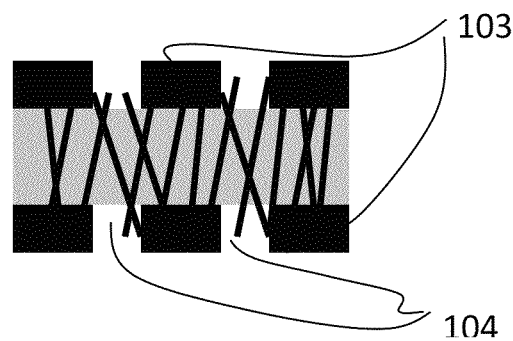
FIG. 1B is a side view of the TIM of FIG. 1A.
Figure 1C:
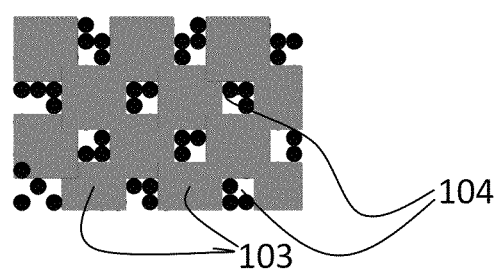
FIG. 1C is a top view of the TIM of FIG. 1A.
Figure 1D:
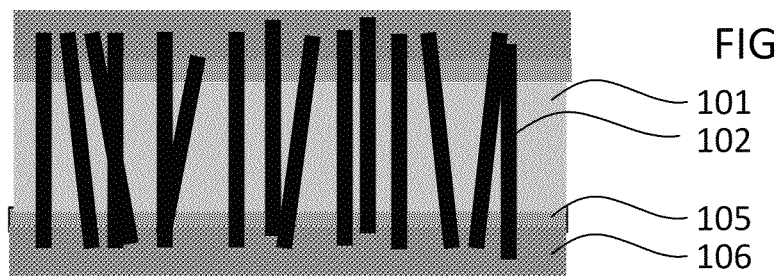
FIG. 1D shows an alternative embodiment to FIG. 1A, with four capping layers.
Figure 1E:
FIG. 1E is an alternative embodiment of FIG. 1B.

FIGS. 1B and 1E are schematics of a side view. In the embodiment of FIG. 1B, the capping layers 104 are patterned. In the embodiment of FIG. 1E, both the matrix 102 and the capping layers 103 are patterned. By judiciously placing voids 104 in the capping layers 103, or a different matrix material occupying these zones, both the mechanical characteristics and the processability could be improved. In general, the nanoparticle paste which preferably forms the capping layers 103 is expected to improve thermal conductivity. Therefore paste should be in contact with anticipated hot spots in the circuitry, while voids 104 should be placed where the circuitry needs less cooling.

FIG. 1C shows a top view of the TIM of FIGS. 1a and 1b, also showing capping layer 103 patterning and voids 104.

FIGS. 1A, 1B and 1C illustrate a sandwich-like TIM with nano-scale fibers 101 between two capping layers 103 formed of paste. More layers of paste might be used. For instance, the first thin layer 105 would be applied to the fibers to promote the adhesion of the second layer 106 to the opposing surfaces as illustrated in FIG. 1D. This figure shows the fibers 101, the polymer matrix 102, a first capping layer 105 and a second capping layer 106. Preferably the first, thinner capping layer 105 is formed of palladium deposited from sputtering or wax processing of nanoparticles or microparticles or other items in a paste that will go away during processing. There may be a modifier to make the palladium soluble in an appropriate solution.

Several different methods of synthesizing nano-scale fibers exist. In particular, with reference to CNTs, there are bulk randomly oriented CNTs, random CNTs in a thin mat, and vertically aligned CNTs (VACNT) on substrates. Those cover a broad TIM performance range while retaining high performance/cost ratios. Because processes such as chemical purification and mechanical mixing break CNTs and introduce defects, preferably the skilled artisan will chose as high a quality CNTs as are currently available and practicable in terms of cost and meet the functional requirements. A number of papers describe methods for synthesizing aligned CNT[15,16].

Randomly oriented clean and long CNTs may be synthesized in large quantities using chemical vapor deposition (CVD). The density of as-synthesized CNT powders can be as low as 30 mg/cm$^3$, which can be tuned to optimize the eventual density in composites and the convenient incorporation of matrix materials. Random CNT mats may be obtained through known methods[17].

In addition to the quality of CNTs, density and thickness are characteristics of CNT mats. Synthesis conditions generally control the density CNT mat and thickness, which is generally achievable in the range of tens of microns.

High density VACNTs of controlled thickness at the vicinity of 10 microns may also be synthesized.

Stabilization:

Fibers, such as CNT networks or arrays, can be stabilized by infiltrating the fibers with a filler, such as monomers or mixture of monomers and nanoparticles (NPs) or microparticles followed by polymerization. Preferably, the fibers are placed in an evacuated chamber to allow entry of the monomers, which otherwise do not easily wet the fibers. The chamber is then ventilated to push the monomers further into the fibers. Voids around fibers are then filled with polymer. This polymer then leaves fiber configuration intact, whether it is an entangled network or aligned tubes. Alternatively, monomers may be pushed in by filtration. In the latter case, NPs loaded in monomers are retained in fibers and accumulated to high concentrations. High concentration means 20-60% by volume. High volume fraction of metallic nano- or micro-particles in the matrix allows for formation of interconnected thermal passages upon NP fusing. The monomers are then polymerized. Hence, the thermal conductivity of the matrix is enhanced greatly. The better thermal conductivity is due to the network passages which form upon the fusion of high concentration nano- or micro-particles. Polymerization of monomers provides mechanical integrity of the structures. Fracture surface morphology of a VACNT composite in accordance with the present process is shown in FIG. 3, showing that the process does not destroy the ordering. Embedded CNTs remain well-aligned. Thus stabilizing the fibers, separate from the device requiring a thermal interface, rather than growing the fibers on the device, allows for more flexibility and lower cost of manufacturing. For example, the fiber mats may be grown under uniform, optimized and tightly controlled conditions, which may be unavailable when seeking to grow the fibers on the device itself.

Figure 5A:
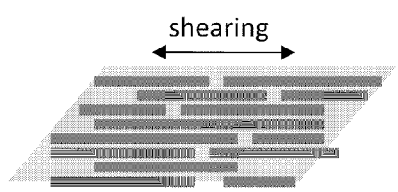
FIG. 5A shows CNT's aligned along a neutral axis responsive to shear from compression.
Figure 5B:
FIG. 5B shows cutting CNT's perpendicular to the neutral axis.

Orientation of CNTs in polymer composites may also be introduced to initially randomly-oriented CNT/polymer composite[9,10,18,19]. In this approach, composites using bulk CNT powders are compressed biaxially followed by curing and polymerization. Biaxial confinement deforms CNT networks, orienting CNTs along the third, or the neutral axis. With deformed CNTs fixed by NP fusion and monomer polymerization, composite films obtained by cutting perpendicular to the neutral axis contain aligned CNTs, resembling the morphology of a composite film prepared using VACNTs. FIG. 5A shows CNTs aligned along a neutral axis responsive to shear from compression. FIG. 5B shows cutting CNT's perpendicular to the neutral axis. Preferably such compression and cutting will be performed prior to application of the capping layer or layers. The CNT may be cut or patterned, for example with a die, laser, water jet, chemical process, optical process, ablative electrical current, or other known cutting tool or mechanism. Indeed, the matrix 102 may be selectively processed after polymerization, to weaken it, and thus permitting a separation.

If CNT mats are used, it is possible to fabricate TIMs with the patterned matrix and leave regularly arranged voids in composite films. Inkjet printing or aerosol deposition may be used to deliver monomers (with or without NPs or microparticles) to targeted locations. A known machine for aerosol deposition is the Optomec M3D printer. Patterning per FIG. 1B is particularly desirable to address the issue of local hot spots, where rapid dissipation in directions both perpendicular and parallel to die surface is required. Patterning is a matter of design optimization, a balance of performance vs. cost. Patterning could reduce the cost while still get work done, i.e. dissipating heat from a hot spot. For example, use of precious metals used in the capping layers are may be minimized. Likewise, by reducing the contact area and providing intentional voids, more even contact between the opposed surfaces at the TIM locations may be assured after compressing the TIM between them.

Analogous stabilization can be provided for other nano-scale fibers.

Capping Layer Deposition:

After stabilization with the filler, composite films may be etched using plasma or reactive ions in order to expose the ends of CNTs or other nano-scale fibers at both surfaces of the film. Therefore, it is preferred that the exposing step does not substantially degrade the fibers. NP (such as Ag) films of a few microns thick are coated to both surfaces of the fiber composite film. Individual NPs are coated with wax-like organic shells, hence NP films are readily deformable under pressure. Seamless joints form between the TIM buffer layers and the solid surfaces after they are pressed between two solid surfaces at 100° C. A heat treatment at about 100° C. drives away the waxy organic molecules in the NP shell, triggering the fusion of NPs to form a contiguous metallic layer. This NP layer may therefore be sintered. This layer may also conform to the roughness features of the solid surfaces, connecting CNTs or other nano-scale fibers from one solid surface to the other with high thermal conductivity passages, especially when formed in situ between the opposed surfaces to be connected by the TIM. A substantial fraction of the fibers are preferably oriented so that their ends are at the surfaces to achieve thermal conductivity. Preferably substantially all of the fibers are so oriented, though as discussed above, the alignment requirement varies in dependence on the application and design criteria.

Alternatively, microparticles may be used. While using both filler and capping layers is expected to enhance mechanical strength and thermal properties—using one or more capping layers alone, without filler between the fibers, may provide an adequate TIM. Also, the fibers stabilized with filler, and without capping layers, may also provide an adequate TIM.

It is further noted that the process may be asymmetric, with the process according to embodiments of the invention provided for only one face of the TIM, with other processes used to interface the other face of the TIM with a respective surface.

Using printing (electrostatic, electrophoretic, ink jet, impact) or lithography techniques, capping layers with carefully designed patterns (such as lines, grids, or pads) may be deposited. A design criterion is to deliver just the right amount of materials to fill the gap between TIM and solid surfaces and create seamless contact.

FIG. 2 shows a portion of the assembly process of a TIM in accordance with an aspect of the invention. In this figure, a conveyor 201 carries fiber composites 202 past an ink jet printer 203, which deposits the nano-particle paste on the fiber composites to form patterns such as shown in FIGS. 1B and 1C.

There are several advantages of fabricating patterned TIM films. The voids in the matrix layer serve as breathing channels that release the trapped air during assembly, and organic molecules during curing NPs capping layers; the voids accommodate thermal expansion cycles and therefore improve mechanical performance and longevity; and the voids also make films more compressible, facilitate the flow of the NP paste to form better contacts, and reduce the packaging pressure.

Once the TIM is completed, it will preferably be added to a device. Adding the TIM to a device will involve temperature and pressure sufficient to remove excessive (and unintended) voids in the material.

FIG. 4 shows how sintered metal paste 402 helps the TIM bond with device surfaces 401. Sandwiched between the capping layers 405 are the nano-scale fibers 403. Each fiber has a first and second end. Substantially all of the fibers 403 are preferably oriented so that their first end is at a first device surface and their second end is at a second device surface. The fibers 403 are stabilized with a filler 404, while the sintered metal paste 402 serves as the capping layers. The paste has voids 406 which give flexibility and improved stress reduction. The paste 402 is preferably located at anticipated hot spots on at least one of the device surfaces 401.

Figure 6:
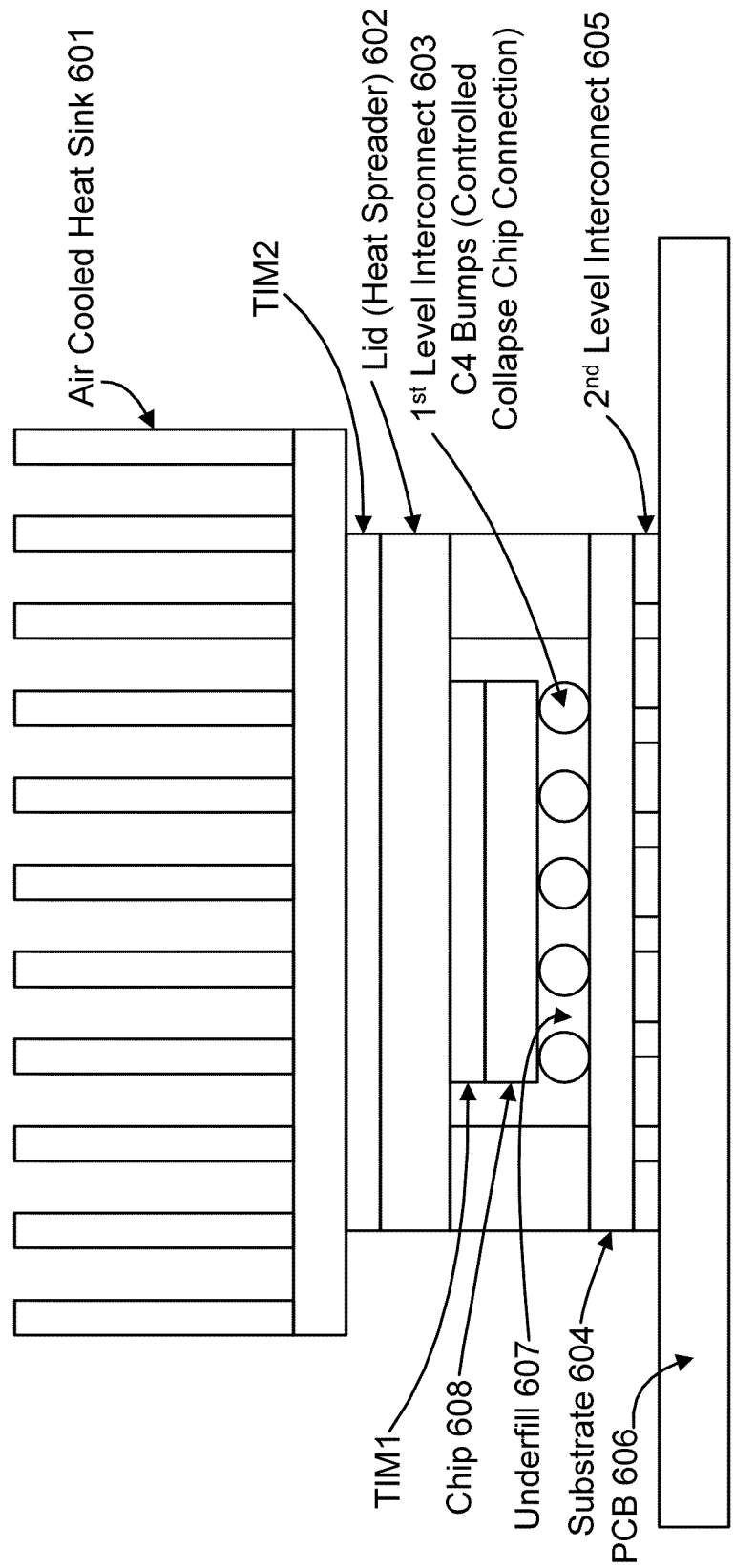
FIG. 6 shows a device incorporating a TIM in accordance with the invention.

FIG. 6 shows a device incorporating a TIM in accordance with the invention. At the top is an air-cooled heat sink 601. Below that is a layer 609 of TIM (TIM2) in accordance with the invention. Below that is a lid 602, which functions as a heat spreader. Below that is another layer 610 of TIM in accordance with the invention (TIM1). Below that is the chip 608. Below that is a layer of first level interconnect C4 bumps 603, also known as flip chip solder bumps, where C4 is the acronym for Controlled Collapse Chip Connection. The bumps 603 are interspersed with underfill 607. The bumps 603 and the underfill 607 rest on a substrate 604. The substrate is connected to the Printed Circuit Board (PCB) 606 via a second level interconnect 605, similar to elements 603 and 607.

A TIM in accordance with the invention is a hybrid materials system. Preferably this system will include various forms of nanomaterials. This TIM will preferably realize one or more of the following goals:

Low temperature application of the TIM, i.e. below 200° C., comparable to the temperature of operation of the device and/or it electrical assembly, to reduce thermal stress during operation;
Minimizing thermal resistance between two solid surfaces,
Usefulness for any applications requiring very high thermal dissipation by joining two solid surfaces,
High bulk thermal conductivity close to theoretical limit of a composite containing CNTs,
Readily deformable surfaces to form intimate contacts with solid surfaces of varying topological and roughness features,
Variable thickness that can be minimized to a few microns,
Mechanical robustness for easy processing and application of TIM as well as long term stability for thermal cycling, and
chemical stability therefore environmental and manufacturing friendliness.

Individual features could be adjusted to optimize the overall performance of the TIM system.

In addition to heat transport, a TIM should reduce or minimize stresses that arise between the devices coupled by the TIM. These stresses may be thermo-mechanical in the sense that they are caused by differences in coefficients of thermal expansion between device areas. Stresses may also be caused by differences in temperatures in different regions of the devices to be coupled. Polymers used in this TIM are preferably chosen to have a low modulus of elasticity. Also, when the TIM is applied, some areas may be unattached to the devices to be coupled to reduce stresses. Similarly there may be voids in the fibers, filler, or capping materials to reduce stresses.

During application to a device, a TIM in accordance with the invention may be further processed to expose the ends of the nano-particles immediately prior to application to a device requiring a thermal interface. Such further processing might include mechanical means, chemical means, or laser ablation.

From reading the present disclosure, other modifications will be apparent to persons skilled in the art. Such modifications may involve other features which are already known in the design, manufacture and use of thermal insulating materials and nano-scale fibers and which may be used instead of or in addition to features already described herein. Although claims have been formulated in this application to particular combinations of features, it should be understood that the scope of the disclosure of the present application also includes any novel feature or novel combination of features disclosed herein either explicitly or implicitly or any generalization thereof, whether or not it mitigates any or all of the same technical problems as does the present invention. The applicants hereby give notice that new claims may be formulated to such features during the prosecution of the present application or any further application derived therefrom.

Statistical Model

NOMENCLATURE r,z Cylindrical Coordinates, m
T Temperature, K
$k_i$ Thermal conductivity of the material i=1, 2, 3, W/mK
h Convective heat transfer coefficient, W/m$^2$K
$q_0$ heat generated per unit volume, W/m$^3$
$q_1$ heat flux applied per unit area, W/m$^2$
$q=q_0 L_1+q_1$, Effective heat flux, W/m$^2$
a radius of the lower cylinder, m
b radius of the middle cylinder, m
c radius of the upper cylinder, m
$L_1$ height of the lower cylinder, m
$L_2$ height of the middle cylinder, m
$L_3$ height of the upper cylinder, m
Q heat flow, W
$h_c$ thermal contact conductance, W/K
$\Delta T$ temperature drop across the interface, K
$k_{gap}$ thermal conductivity of the gap, W/mK
$A_{gap}$ area occupied by the gap, m$^2$
$L_{gap}$ length of the gap, m
$R_{gap}$ resistance due to the gap, K/W
P Percentage of area occupied by the nanotubes on silicon
A Area of the thermal interface material layer, m$^2$
L Thickness of the thermal interface layer, m
$R_{\it eff}$ Effective thermal resistance of the thermal interface layer, K/W
$K_{\it eff}$ Effective thermal conductivity of the thermal interface layer, W/mK
$K_{bulk}$ Thermal conductivity of the nanotubes, W/mK
Subscripts
∞ ambient
i 1, 2, 3 . . .

Figure 7:
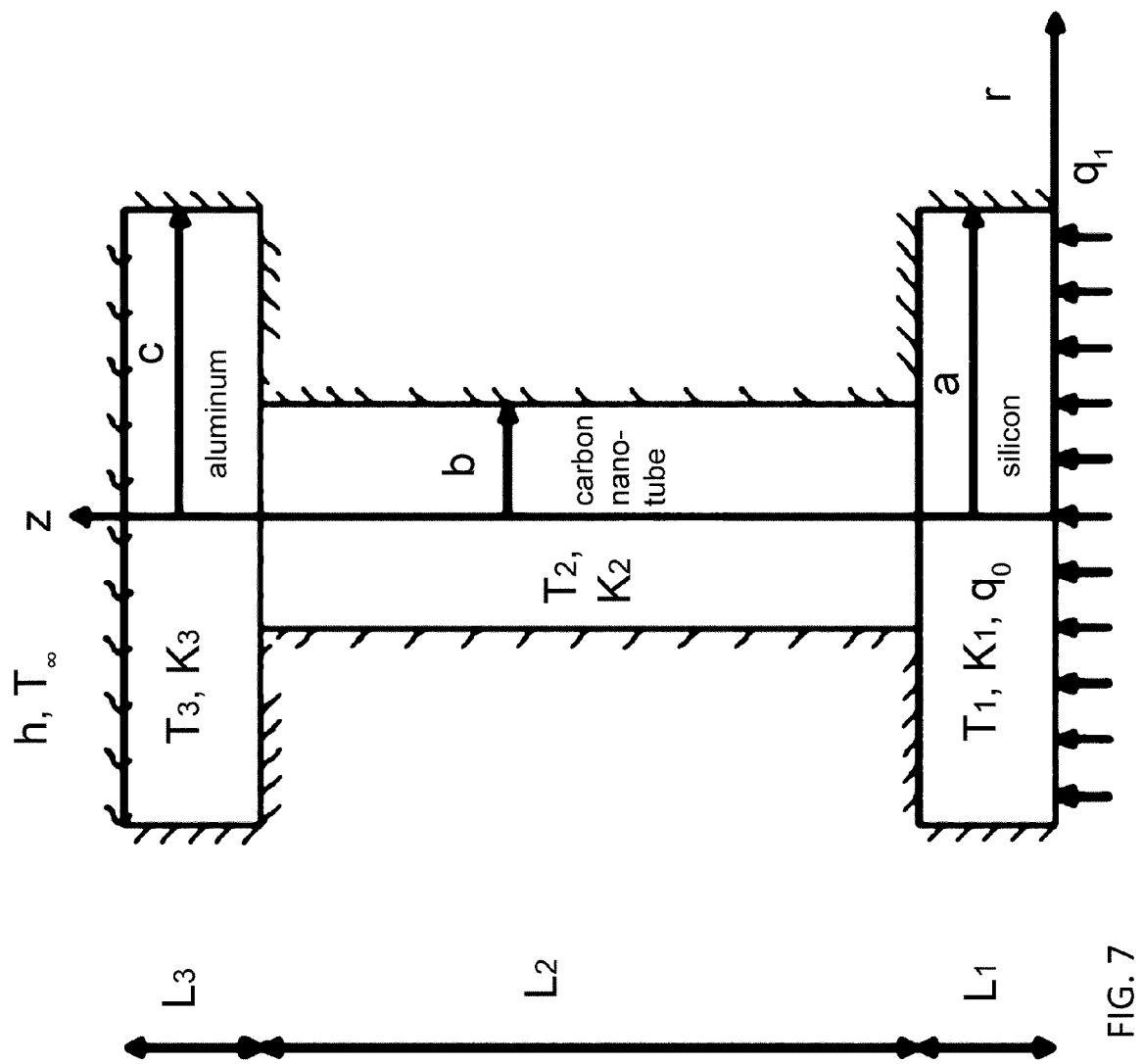
FIG. 7 shows a schematic diagram of a periodic element used in models of the TIM.

An analysis was conducted of the TIM system for configurations in which the thickness of the heat source is also taken into account. Both specified heat generation and specified uniform heat flux can be applied to the system. The details of the analytical solution are given in Desai et al.[21], expressly incorporated herein by reference. In Desai et al.[22], expressly incorporated herein by references, numerical and analytical models are built for a periodic element (or a unit cell element) of the system of vertically aligned nanotubes between silicon and aluminum surfaces. The size of the periodic element is determined by the size of the nanotubes, and the percentage of area they occupy on the silicon surface (assuming they are uniformly distributed on the silicon surface). The size of the silicon surface is 1cm×1 cm. The periodic element is assumed to be cylindrical. FIG. 7 represents one such periodic element.

Figure 8:
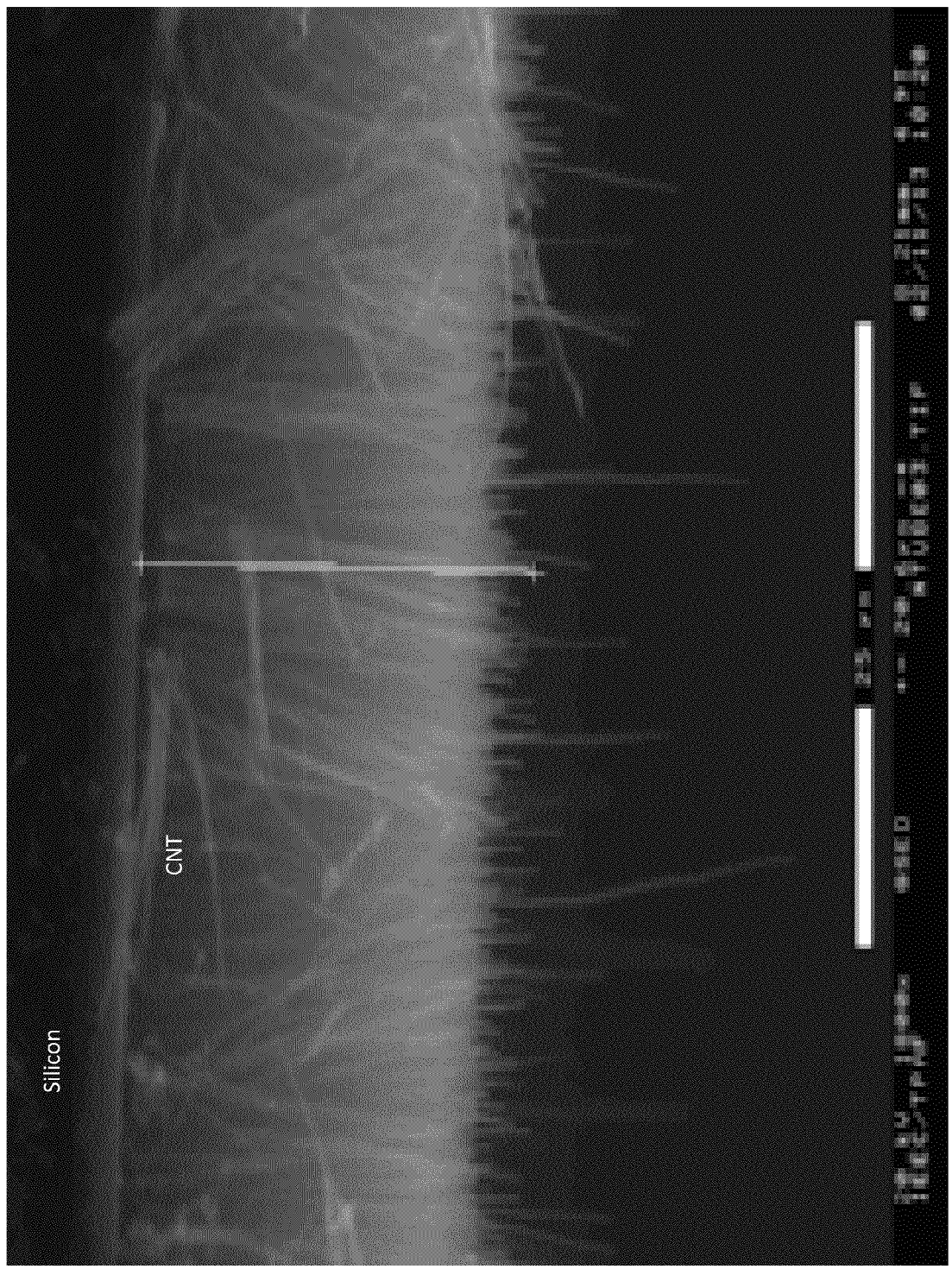
FIG. 8 shows an SEM image (Inverted side view) of vertically aligned carbon nanotubes (CNT) at 1,800× magnification, wherein the average height of the tubes is around 25 microns.
Figure 9:
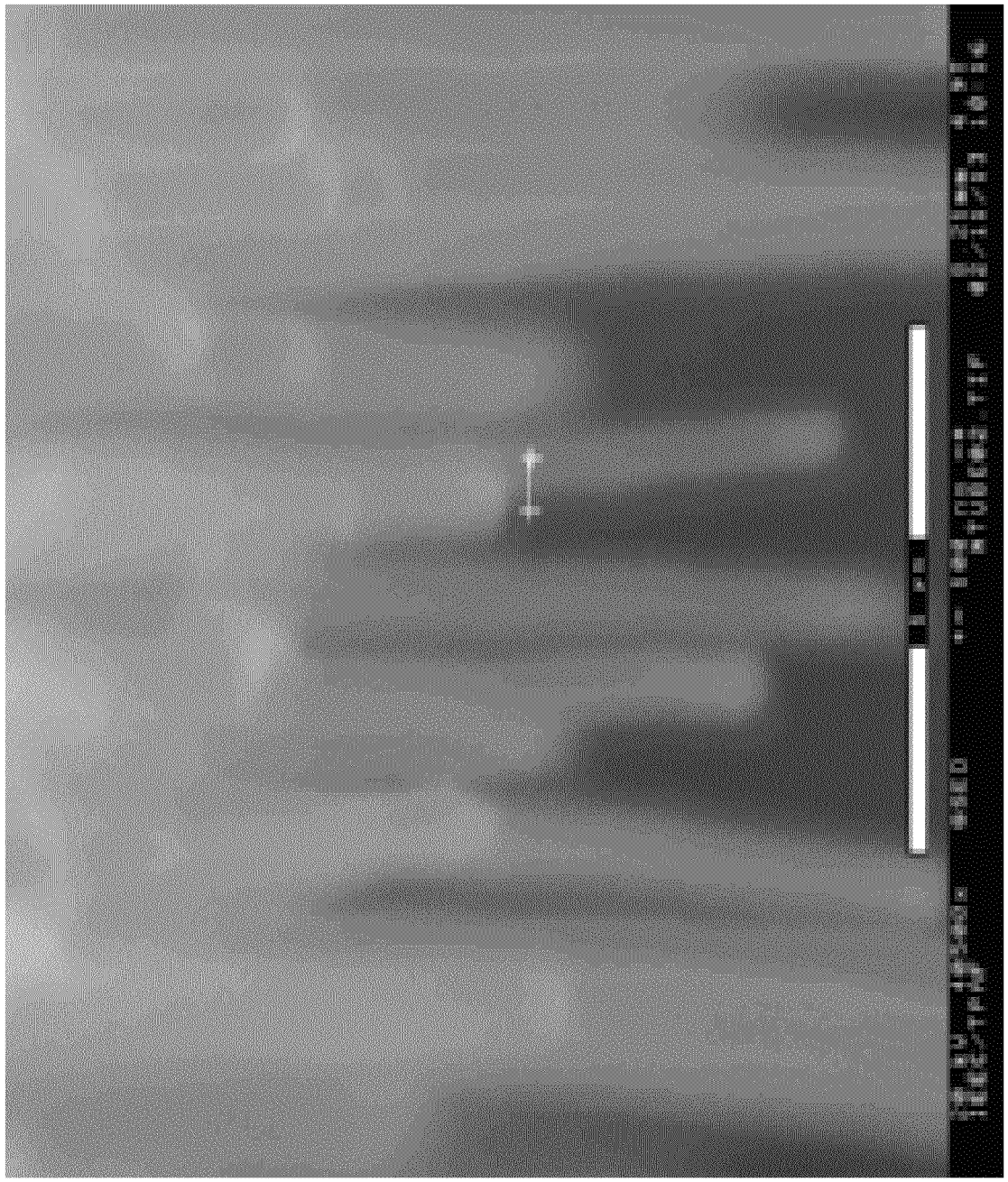
FIG. 9 shows an SEM image of vertically aligned carbon nanotubes at 40,500× magnification, wherein the diameter of the tube that is measured here is 100 nm.

As can be seen from the micrographs shown in FIGS. 8 and 9, the vertically aligned nanotubes grown on a silicon substrate do not have the same height. To take into account the size variation and to analyze the effect of this variation on the effective thermal conductivity of the system, a statistical approach is applied. An analytical solution presented in Desai et al.[21] is used along with a random number generator to represent variations in heights of nanotubes over the chip area. A statistical analysis may then be carried out on the different heights of the tubes and a corresponding temperature drop calculated for that system (combination of many unit cells). The results obtained indicate that considering a small system is sufficient to accurately model the effect of variation of height over the chip area.

In practice, the nanotubes are grown off a surface (silicon) and the height to which the nanotubes grow cannot be controlled with great precision. Hence, there will be a small gap between some of the nanotubes and the aluminum interface. The analytical solution from Desai et al.[21] may be used for modeling a unit cell as shown in FIG. 7. The variation in height is accounted for by taking the resultant temperature drop in the gap between the end of the nanotube and the aluminum surface in short tubes and applying the same as an interface temperature drop, as given by relation (1) below.

$$R_{gap} = \frac{L_{gap}}{k_{gap} A_{gap}} \quad (1)$$

Then, $$\Delta T_{gap} = Q R_{gap}, \quad (2)$$

where $k_{gap}$ is the thermal conductivity of the gap, $A_{gap}$ is the area occupied by the gap, and $L_{gap}$ is the length of the gap. Q is the heat flowing through the nanotube. This model is then coupled with a random number generator, which assigns a height to the tubes randomly, and results obtained for a series of interations. The thermal resistance of each of the nanotubes is stored. The effective resistance of the thermal interface layer is calculated by combining the individual resistances in parallel. The effective resistance is then used to evaluate the one-dimensional effective thermal conductivity of the TIM layer using the relation, $$k_{eff} = \frac{L}{R_{eff} A}. \quad (3)$$

The result is a model of many vertical nanotubes to form a miniature version of the TIM system.

Two different random distributions are considered. First is a normal random distribution with mean as the mean height of the nanotubes and standard deviation σ=1 micron. The second distribution is a uniform random distribution, which generates random numbers whose elements are uniformly distributed in the range of the mean, +/−3 micron. The results are compared for these two random distributions.

Two different analyses are considered for modeling the effects of height variation across the thermal interface material. In the first analysis it is assumed that the nanotubes which are smaller than the mean height do not contribute to the effective thermal conductivity (i.e., the resistance of the matrix is very high so there is essentially no heat flowing through these tubes, $K_{gap}$=0.001 W/mK). The second analysis uses equation (1) to determine the resistance of the short tube ($K_{gap}$=4 W/mK), and then uses the resistance of the matrix material and the spreading resistance of the tube with the matrix material added. In the second case the short tubes also contribute to the effective conductivity calculation. This results in four different cases:

1) Normal finite—Normal random distribution with finite resistance for the short tube. In this case, short tubes contribute to the effective thermal conductivity of the TIM.

2) Normal infinite—Normal random distribution with infinite resistance for the short tube. So that short tubes do not contribute to the effective thermal conductivity of the TIM.

3) Uniform finite—Uniform random distribution with finite resistance for the short tube. In this case, short tubes also contribute to the effective thermal conductivity of the TIM.

4) Uniform infinite—Uniform random distribution with infinite resistance for the short tube, so that short tubes do not contribute to the effective thermal conductivity of the TIM.

Figure 10:
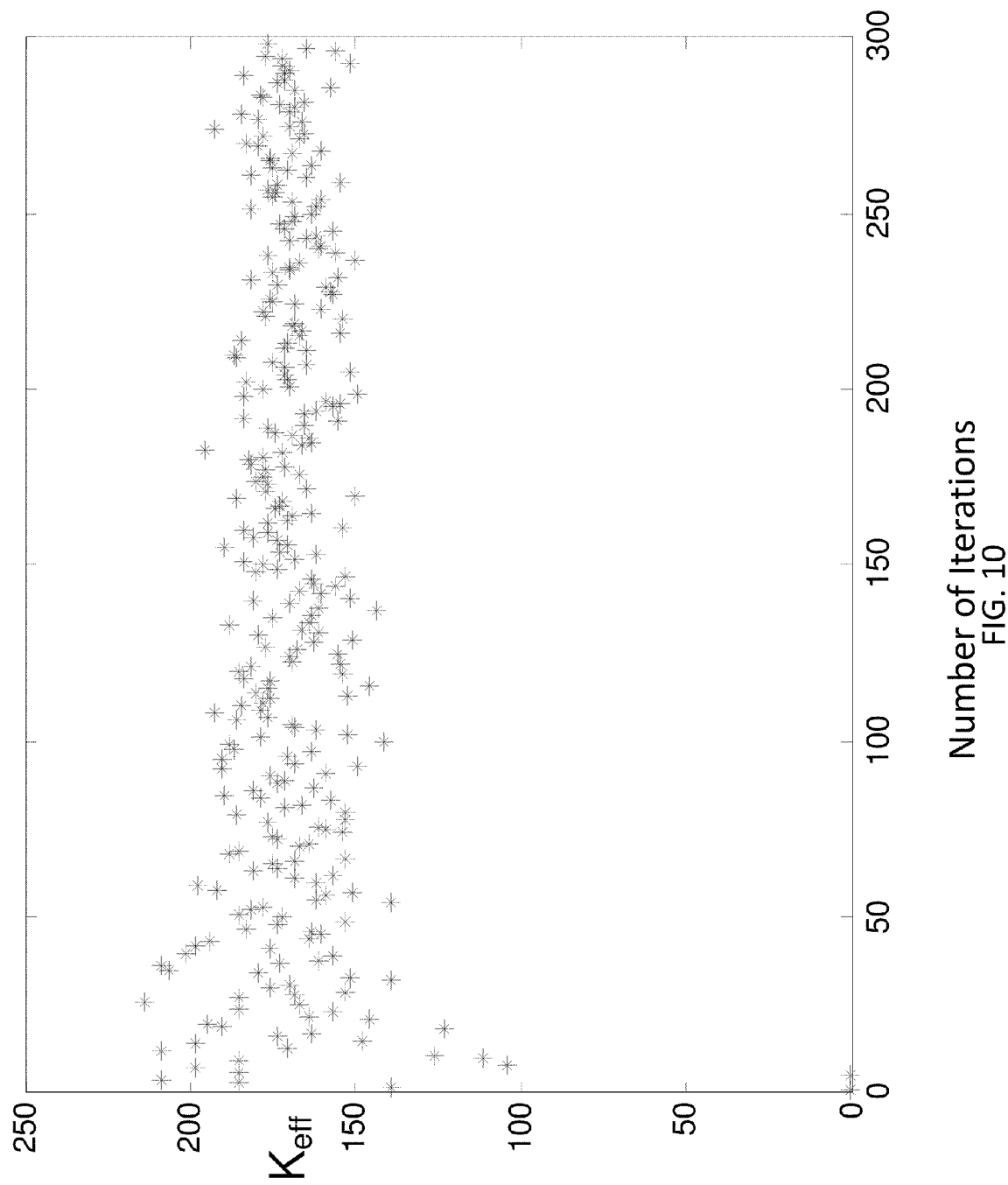
FIG. 10 shows a plot of nanotube elements modeled with random normal distribution length variation and with infinite thermal resistance in the interface ($K_{gap}$=0.001 W/mK), showing the distribution thermal conductivity convergence.

FIG. 10, shows a plot of number of runs (same as the number of unit cells used in the model) versus the effective thermal conductivity of the matrix for a normal distribution with infinite resistance of the shorter nanotubes. 300 Iterations were required to obtain the required convergence for case 2. In the other cases similar convergence analyses were performed. For case 1, 300 iterations gave a converged solution. For case 3, 200 iterations and, for case 4, 100 iterations gave a converged solution.

TABLE 1

Normal distribution effective conductivity values as a function of percentage of area occupied for finite resistance case.

| | $K_{bulk}$ W/mK | | |
|---|---|---|---|
| | 2500 | 1000 | 500 |
| P | $K_{eff}/K_{bulk}$ | $K_{eff}/K_{bulk}$ | $K_{eff}/K_{bulk}$ |
| 10 | 0.063 | 0.071 | 0.079 |
| 30 | 0.169 | 0.185 | 0.201 |
| 50 | 0.272 | 0.286 | 0.317 |

Figure 11:
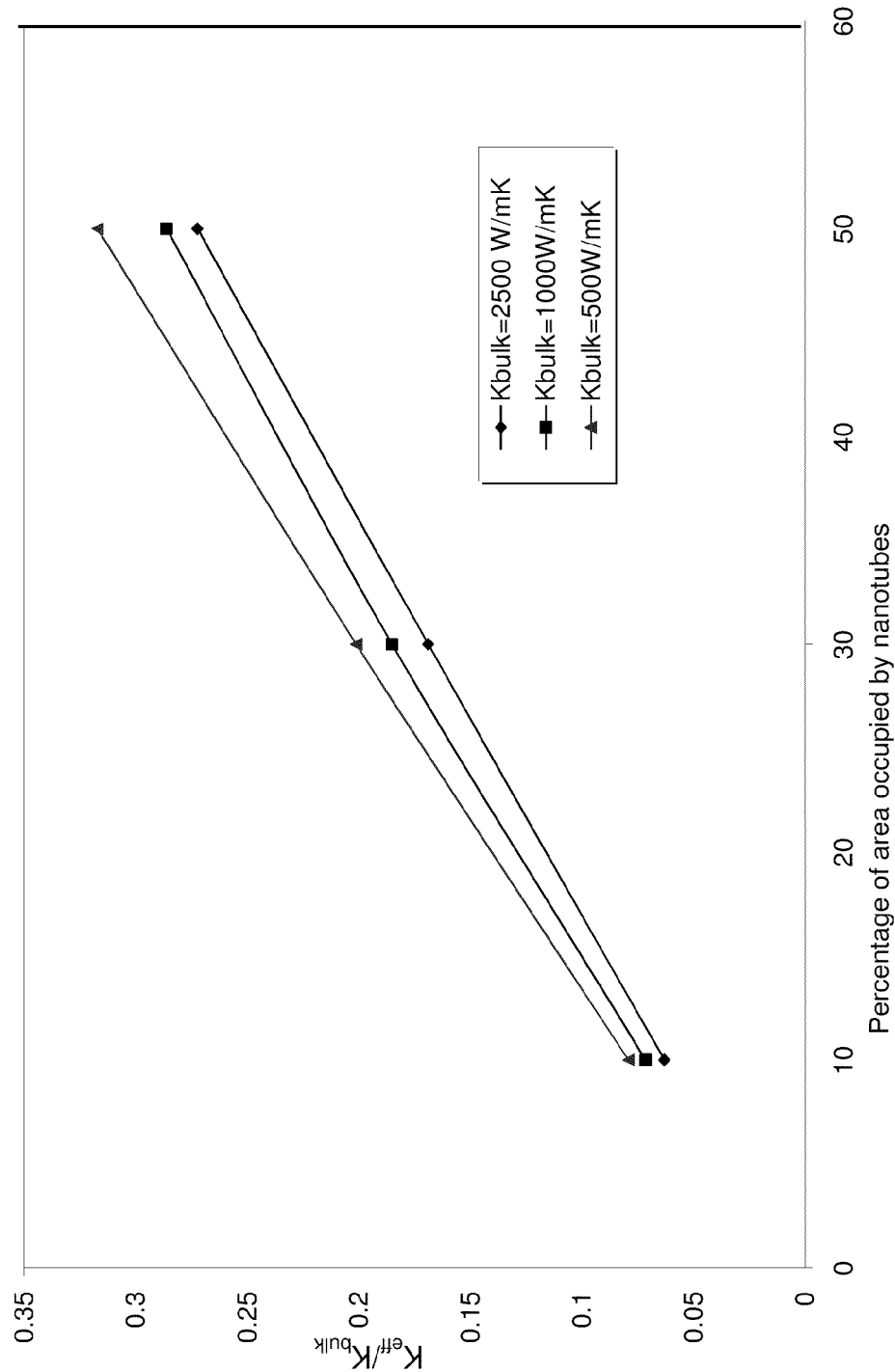
FIG. 11 shows a graph of the ratio of effective thermal conductivity to the bulk conductivity plotted against the percentage of area occupied by the nanotubes on the silicon surface for the normal distribution case with finite resistance case.

Table 1 and FIG. 11 are the results obtained for the normal distribution with finite effective thermal conductivity analyses. The effective thermal conductivity is scaled with the bulk thermal conductivity of the nanotubes and is plotted against the percentage of area occupied by the nanotubes. The results indicate that taking the average of more than six runs (three lines shown in the plot) would result in the three lines shown here collapsing into a single line.

Figure 12:
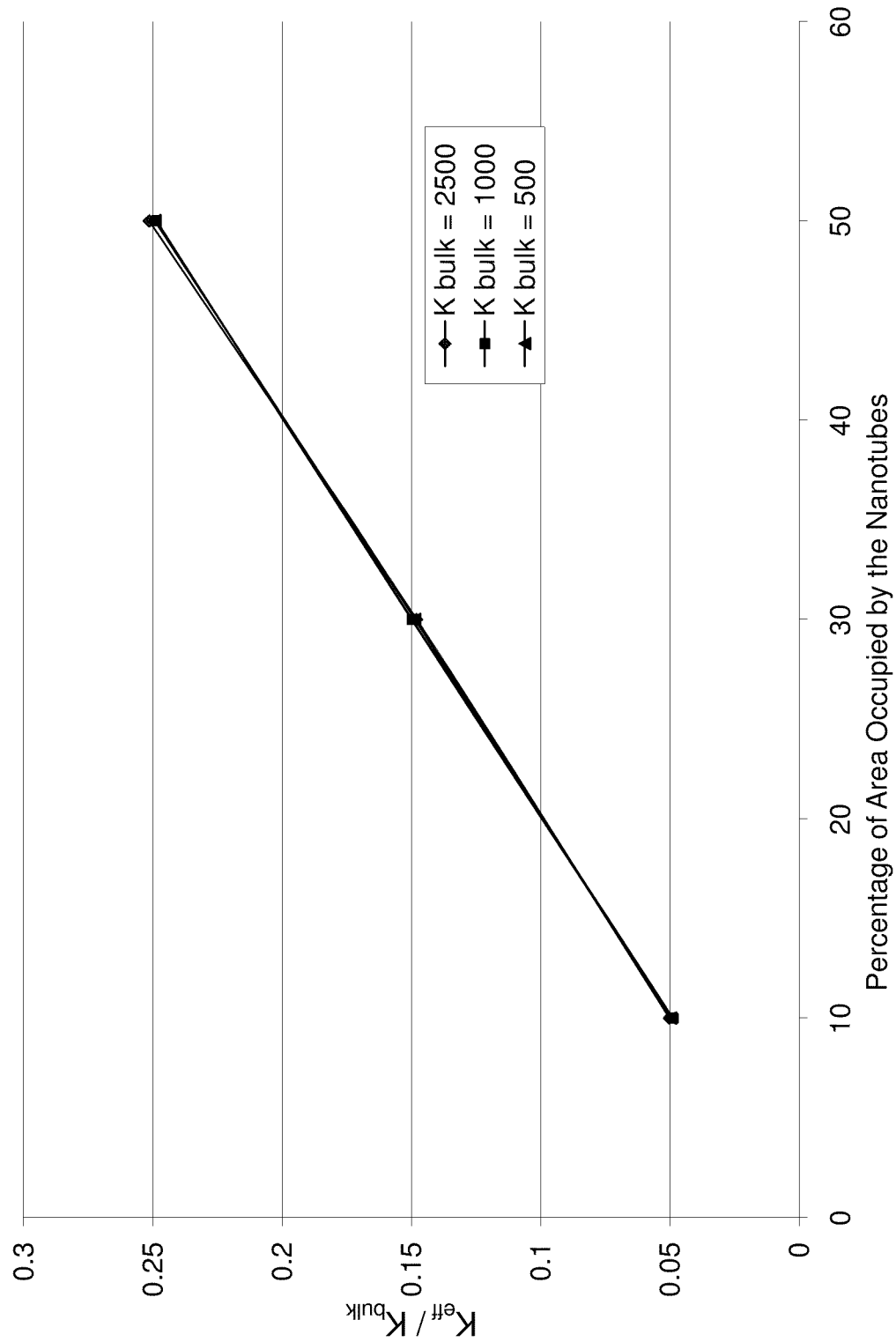
FIG. 12 shows a graph of the ratio of effective thermal conductivity to the bulk conductivity plotted against the percentage of area occupied by the nanotubes on the silicon surface for the normal distribution infinite resistance case.

The results for normal distribution with infinite resistance are presented in Table 2 and FIG. 12. Plotting the dimensionless thermal conductivity against the percentage of area occupied by the nanotubes results in three lines that lie nearly on top of each other, converging all the data into a single line.

TABLE 2

Normal distribution infinite effective conductivity values as a function of percentage of area occupied.

| | $k_{bulk}$ W/mK | | |
|---|---|---|---|
| | 2500 | 1000 | 500 |
| P | $k_{eff}/k_{bulk}$ | $k_{eff}/k_{bulk}$ | $k_{eff}/k_{bulk}$ |
| 10 | 0.05 | 0.048 | 0.049 |
| 30 | 0.148 | 0.149 | 0.149 |
| 50 | 0.251 | 0.248 | 0.25 |

Figure 13:
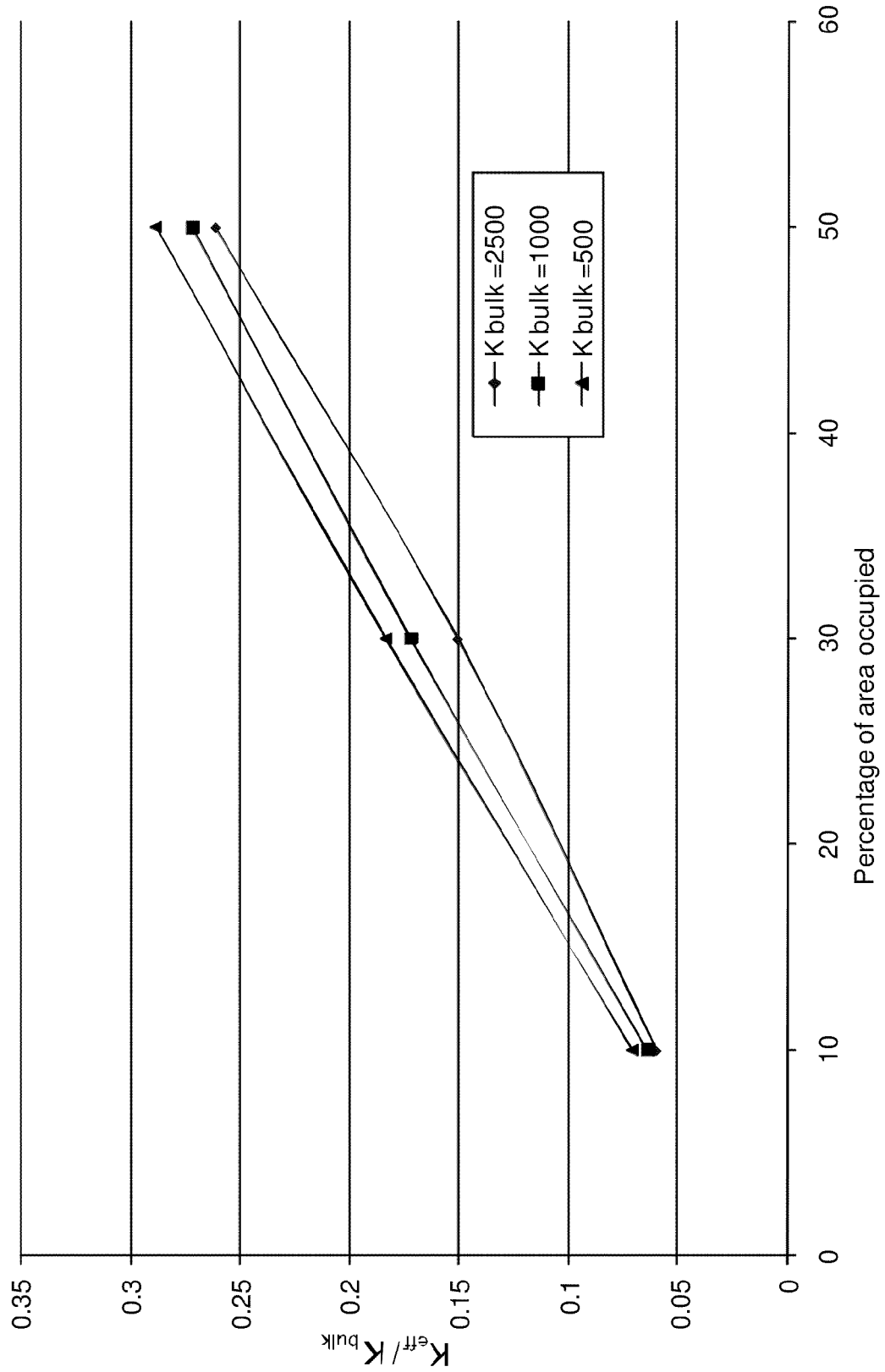
FIG. 13 shows a graph of the ratio of effective thermal conductivity to the bulk conductivity plotted against the percentage of area occupied by the nanotubes on the silicon surface for the uniform distribution finite case.

Table 3 and FIG. 13 show the results obtained for the uniform distribution with finite effective thermal conductivity analyses. The effective thermal conductivity is scaled with the bulk thermal conductivity of the nanotubes and plotted against the percentage of area occupied by the nanotubes. The results indicate that taking average of more than six runs (three lines shown in the plot) would result in the three lines shown here collapsing into a single line.

TABLE 3

Uniform distribution finite effective conductivity values as a function of percentage of area occupied.

| | $K_{bulk}$ W/mK | | |
|---|---|---|---|
| | 2500 | 1000 | 500 |
| P | $k_{eff}/k_{bulk}$ | $k_{eff}/k_{bulk}$ | $k_{eff}/k_{bulk}$ |
| 10 | 0.06 | 0.0637 | 0.0713 |
| 30 | 0.15 | 0.172 | 0.183 |
| 50 | 0.26 | 0.272 | 0.288 |

Figure 14:
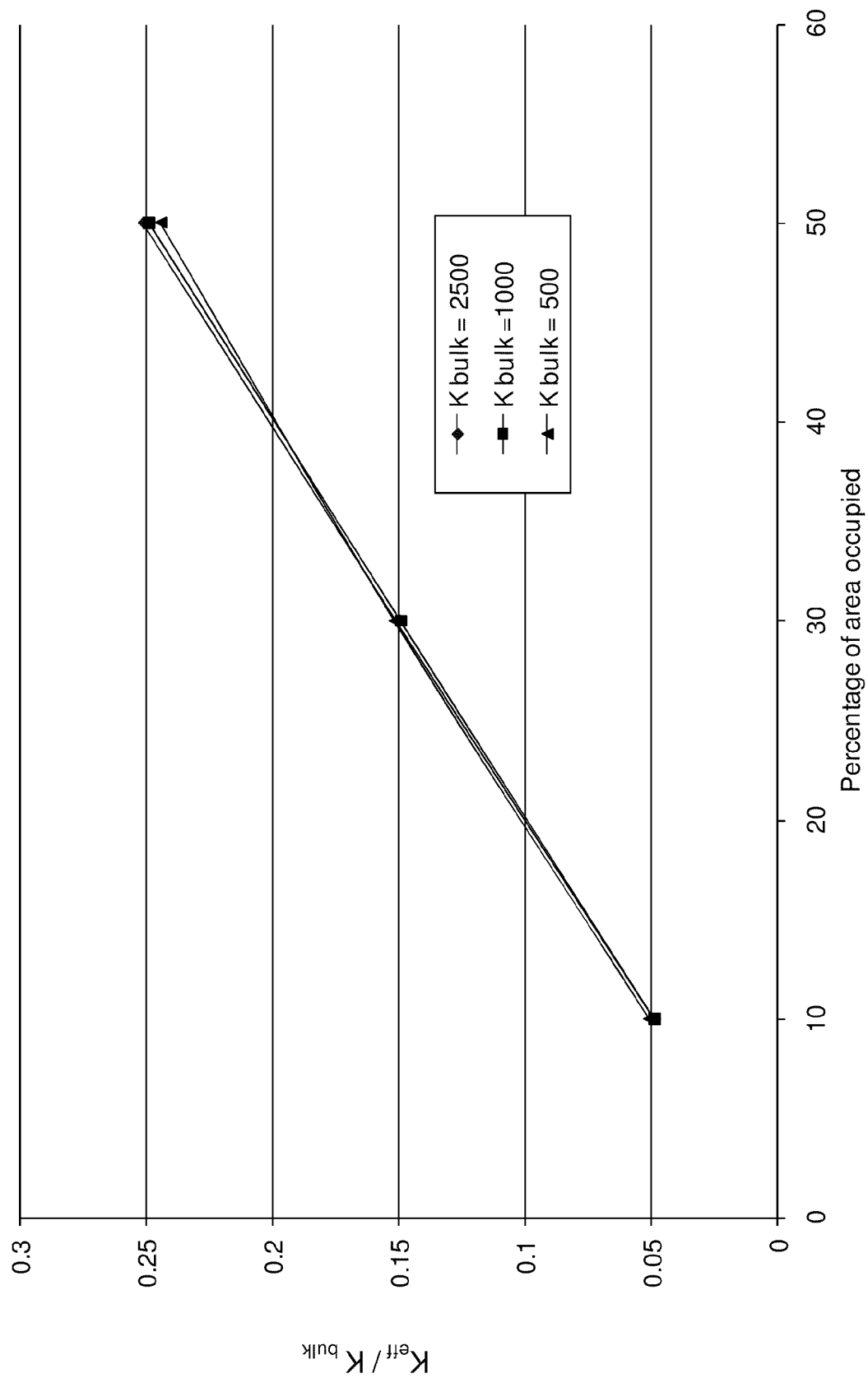
FIG. 14 shows a graph of the ratio of effective thermal conductivity to the bulk conductivity plotted against the percentage of area occupied by the nanotubes on the silicon surface for the uniform distribution infinite case.
Figure 15:
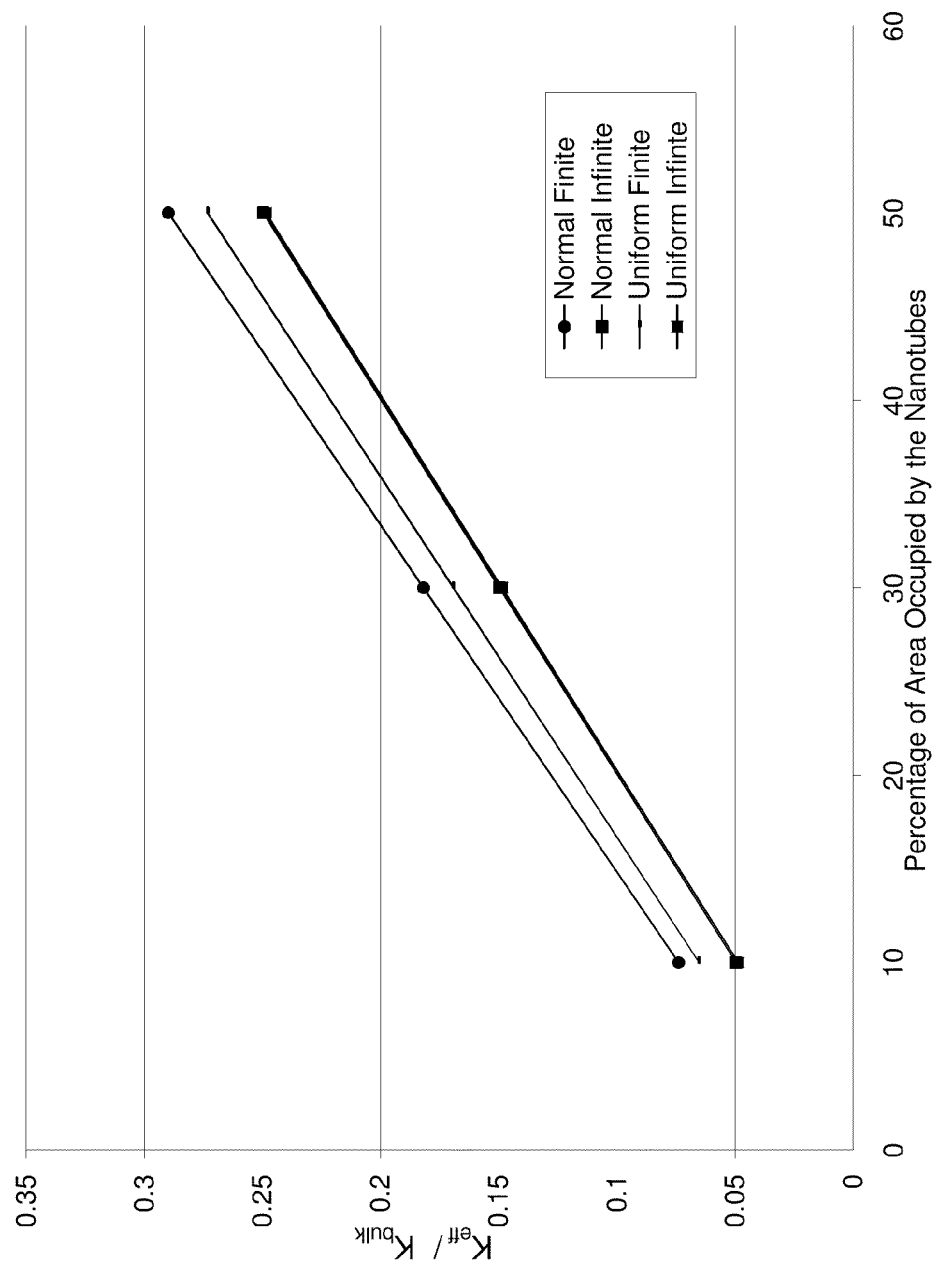
FIG. 15 shows a plot of the average value of the ratio of effective thermal conductivity to the bulk conductivity against the percentage of area occupied by the nanotubes on the silicon surface for all the four statistical models.

The results for uniform distribution with infinite resistance are presented in Table 4 and FIG. 14. In FIG. 15, the collapsed single line (linear fit line through all the lines in case of infinite resistance case and the centre line in case of the finite resistance case) in each case is plotted against the percentage of area occupied by nanotubes. The two lower lines lying on top of each other in FIG. 15 are the lines for infinite resistance case with normal and uniform distributions. They lie nearly on top of each other, as in both cases there are 50% of the tubes that are longer or of equal height as the gap and they contribute to the effective thermal conductivity and the other 50% do not contribute at all. In the uniform distribution with finite resistance the tubes shorter than the gap height contribute to the effective conductivity and hence this gives a higher effective thermal conductivity then the infinite resistance case. In the normal distribution with finite resistance case the tubes shorter than the gap height contribute to the effective conductivity with a tighter distribution of the height of the nanotubes towards the mean (normal distribution with σ=1) and hence this gives a higher effective thermal conductivity then the uniform distribution with finite resistance case.

TABLE 4

Uniform distribution infinite resistance case effective conductivity values as a function of percentage of area occupied.

| | $K_{bulk}$ W/mK | | |
|---|---|---|---|
| | 2500 | 1000 | 500 |
| P | $k_{eff}/k_{bulk}$ | $k_{eff}/k_{bulk}$ | $k_{eff}/k_{bulk}$ |
| 10 | 0.048 | 0.048 | 0.05 |
| 30 | 0.15 | 0.15 | 0.151 |
| 50 | 0.25 | 0.25 | 0.244 |

The results indicate that the normal distribution with finite resistance of short nanotubes case give the highest thermal conductivity of all the four cases. Also, a parametric analysis is carried out by varying the thermal conductivity of the nanotubes and the percentage of area they occupy on the silicon surface. By scaling the thermal conductivity with the bulk conductivity and plotting this against the percentage of area occupied, all the lines converge into a single line. The results indicate that, despite the effects of height variation, a thermal interface material with vertically aligned carbon nanotubes has the potential to be a high thermal conductivity thermal interface material.

The word "comprising", "comprise", or "comprises" as used herein should not be viewed as excluding additional elements. The singular article "a" or "an" as used herein should not be viewed as excluding a plurality of elements. The word "or" should be construed as an inclusive or, in other words as "and/or".

REFERENCES

[1] National Electronics Manufacturing Initiative (NEMI) Roadmap, 2005.

[2] Interface Material Selection and a Thermal Management Technique in Second-Generation Platforms Built on Intel® Centrino™ Mobile Technology, *Intel Technology Journal*, E. C. Samson et al., Vol. 9, Issue 1, pp. 75-86, February 2005.

[3] S. Berber, Y. K. Kwon, and D. Tomanek, "Unusually high thermal conductivity of carbon nanotubes," *Phys. Rev. Lett.*, vol. 84, pp. 4613-4617, 2000.

[4] S. Maruyama, "A molecular dynamics simulation of heat conduction of a finite length single-walled carbon nanotube," *Microsc. Thermophys. Eng.*, vol. 7, pp. 41-50, 2003.

[5] J. W. Che, T. Cagin, and W. A. Goddard, "Thermal conductivity of carbon nanotubes," *Nanotechnology*, vol. 11, pp. 65-69, 2000.

[6] P. Kim, L. Shi, A. Majumdar, and P. L. McEuen, "Thermal transport measurements of individual multiwalled nanotubes," *Phys. Rev. Lett.*, vol. 87, no. 21, pp. 215502-1-215502-4, November 2001.

[7] S. U.S. Choi, Z. G. Zhang, W. Yu, F. E. Lockwood, and E. A. Grulke, "Anomalous thermal conductivity enhancement in nanotube suspensions," *Appl. Phys. Lett.*, vol. 79, pp. 2252-2254, 2001.

[8] M. J. Biercuk, M. C. Llaguno, M. Radosavljevic, J. K. Hyun, A. T. Johnsond, and J. E. Fischer, "Carbon nanotube composites for thermal management," *Appl. Phys. Lett.*, vol. 80, pp. 2667-2769, 2002.

[9] M. Moniruzzaman, K. I. Winey, "Polymer nanocomposites containing carbon nanotubes", Macromolecules, 39 (16): 5194-5205, 2006.

[10] Q. Ngo, B. A. Gurden, A. M. Cassell, G. Sims, M. Meyyappan, J. Li, and C. Y. Yang, "Thermal interface properties of cu-filled vertically aligned carbon nanofiber arrays," *Nano Lett.*, vol. 4, pp. 2403-2407, 2004.

[11] J. Xu and T. S. Fisher, "Enhancement of thermal interface materials with carbon nanotube arrays," *Int. J. Heat Mass Transf*, vol. 49, pp. 1658-1666, 2006, ibid, "Enhancement of thermal contact conductance using carbon nanotube arrays," *IEEE Trans. Comp. Packg. Tech*. vol. 29, pp. 261-267, 2006.

[12] H. Huang, C. Liu, Y. Wu, S. Fan, "Aligned carbon nanotube composite films for thermal management", Adv. Mater, 17, pp. 1652-1656, 2005, ibid, "Effects of surface metal layer on the thermal contact resistance of carbon nanotube arrays", APPL. PHYS. LETT. 87, 213108, 2005.

[13] Tian, Weixue; Yang, Ronggui, "Effect of interface scattering on phonon thermal conductivity percolation in random nanowire composites," 90 *Applied Physics Letters* 26: Art. No. 263105 Jun. 25, 2007.

[14] Yang R G, Chen G, Dresselhaus M S, "Thermal conductivity of simple and tubular nanowire composites in the longitudinal direction", 72 *Physical Review B* 12: Art. No. 125418 SEPTEMBER 2005.

[15] Z. F. Ren, Z. P. Huang, J. W. Xu, J. H. Wang, P. Bush, M. P. Siegal and P. N. Provincio, "Synthesis of large arrays of well-aligned carbon nanotubes on glass" 282 *Science* 1105 (1998).

[16] Z. W. Pan, S. S. Xie, B. H. Chang, C. Y. Wang, L. Lu, W. Liu, W. Y. Zhou, W. Z. Li, and L. X. Qian, "Very long carbon nanotubes" 394 *Nature* 631 (1998).

[17] Coquay, P., De Grave, E., Peigney, A., Vandenberghe, R. E. & Laurent, "C. Carbon nanotubes by a CVD method. Part I: Synthesis and characterization of the (Mg, Fe)O catalysts," 106 *Journal Of Physical Chemistry B* 13186-13198 (2002)., ibid, "Carbon nanotubes by a CVD method. Part II: Formation of nanotubes from (Mg, Fe)O catalysts," 106 *Journal Of Physical Chemistry B* 13199-13210 (2002).

[18] Fischer J E, Zhou W, Vavro J, et al. "Magnetically aligned single wall carbon nanotube films: Preferred orientation and anisotropic transport properties," JOURNAL OF APPLIED PHYSICS 93 (4): 2157-2163 FEB 15 2003.

[19] Garcia E J, Hart A J, Wardle B L, Slocum A H, "Fabrication and nanocompression testing of aligned carbon-nanotube-polymer nanocomposites," 19(16) *Advanced Materials* 2151-+Aug. 17, 2007.

[20] Iijima S, "Helical microtubules of graphitic carbon", Nature, Volume 354, Pages 56-58, 1991.

[21] Anand Desai, James Geer, and Bahgat Sammakia, "Models of Steady State Heat Conduction in Multiple Cylindrical Domains", Journal of Electronic Packaging, Volume 128, Number 1, Pages 10-17.

[22] Anand Desai, James Geer, and Bahgat Sammakia, "An Analytical Study of Transport in a Thermal Interface Material enhanced with Carbon nanotubes", Journal of Electronic Packaging, Volume 128, Number 1, Pages 92-97.

What is claimed is:

1. A thermal interface material comprising a sheet comprising anisotropically oriented thermally conductive nano-scale fibers, the nano-scale fibers of the sheet being organized to be self-supporting and having at least one exposed surface; a stabilizing material comprising thermally conductive microparticles or nanoparticles in a matrix, disposed in at least a portion of an inter-fiber void space between the nano-scale fibers in the sheet, effective to maintain the anisotropic orientation of the thermally conductive nano-scale fibers; a capping layer in direct contact with an end portion of the fibers proximate to an exposed surface of the sheet, the fibers extending beyond the stabilizing material and into the capping layer wherein the fibers comprise at least one of carbon nanotubes, carbon columns, silver nanowires, copper nanowires, a high thermal conductivity metal alloy, and the stabilizing material comprises an organic polymer; and a device having a surface wherein the exposed surface of the sheet is selectively bonded to the device surface to provide a pattern of bonded and unbonded portions of the exposed surface of the sheet are slidable against the device surface without substantially inducing shear stress.

2. The thermal interface material according to claim 1, wherein the fibers comprise carbon, and the capping layer comprises palladium.

3. The thermal interface material according to claim 1, wherein the fibers comprise carbon, and the capping layer comprises a solder.

4. The thermal interface material according to claim 1, wherein the stabilization material has a lower modulus of elasticity than the fibers; and
at least one of sheet and stabilization material are configured to be selectively disposed at predefined hot spots on a device to be cooled, with at least some gaps elsewhere, whereby stresses are reduced.

5. The thermal interface material according to claim 1, wherein the sheet has first and second surfaces, and each nano-scale fiber has respective first and second ends, the fibers being oriented such that a substantial fraction of the fibers have their respective first ends at the first surface and their second ends at the second surface, so that the fibers directly conduct heat between the first and second surfaces.

6. The thermal interface material according to claim 5, further comprising at least one capping layer having a direct thermal interface with at least one of the first ends and the second ends of the fibers.

7. The thermal interface material according to claim 1, wherein the stabilizing material comprises a polymerizable material having a concentration of nanoparticles of 20-60% by volume, a thermal conductivity of the nanoparticles being greater than a thermal conductivity of the polymerizable material after polymerization.

8. The thermal interface material according to claim 7, wherein nano -scale fibers have respective ends generally aligned toward opposite surfaces of the sheet, the ends on at least one surface selectively extending beyond the stabilizing material into a capping layer, the capping layer comprising metallic microparticles which are at least 1micron in size.

9. The thermal interface material according to claim 1, wherein the thermal interface material is configured to reduce mechanical stresses that arise between devices thermally and mechanically coupled by the thermal interface material, as compared to a direct bonding of surfaces of the devices.

10. The thermal interface material according to claim 9, wherein the thermal interface material is configured to reduce a stress between devices caused by at least one of differences in coefficient of thermal expansion, and differences in temperature.

11. A thermal interface material for cooling a device having a surface comprising a sheet comprising anisotropically oriented thermally conductive nano-scale fibers, the nano-scale fibers of the sheet being organized to be self-supporting and having at least one exposed surface; a stabilizing material comprising thermally conductive microparticles or nanoparticles in a matrix, disposed in at least a portion of an inter-fiber void space between the nano-scale fibers in the sheet, effective to maintain the anisotropic orientation of the thermally conductive nano-scale fibers; wherein the stabilization material has a lower modulus of elasticity than the fibers; and the sheet and stabilization material are selectively disposed at predefined hot spots on the surface of the device to be cooled, with at least some gaps elsewhere at which the sheet and the stabilization material are not disposed at the surface of the device to be cooled, whereby stresses are reduced; a capping layer in direct contact with an end portion of the fibers proximate to an exposed surface of the sheet, the fibers extending beyond the stabilizing material and into the capping layer wherein the fibers comprise at least one of carbon nanotubes, carbon columns, silver nanowires, copper nanowires, a high thermal conductivity metal alloy, and the stabilizing material comprises an organic polymer.

12. A thermal interface material comprising a plurality of nano-scale fibers having an anisotropic orientation organized to form a self-supporting sheet of nano-scale fibers; and a stabilizing material comprising thermally conductive microparticles or nanoparticles in a matrix formed in an inter-fiber space, which retains the fibers in their anisotropic orientation within the self-supporting sheet; a capping layer in direct contact with an end portion of the fibers proximate to an exposed surface of the sheet, the fibers extending beyond the stabilizing material and into the capping layer wherein the fibers comprise at least one of carbon nanotubes, carbon columns, silver nanowires, copper nanowires, a high thermal conductivity metal alloy, and the stabilizing material comprises an organic polymer; further comprising a device having a surface, wherein the thermal interface material is selectively bonded to the surface of the device to provide bonded portions at which the thermal interface material is bonded the surface of the device and unbonded portions at which the thermal interface material is unbonded and slidable with respect to the surface of the device.

13. The material of claim 12, wherein the fibers comprise carbon nanotubes.

14. The material of claim 12, wherein the fibers comprise carbon columns.

15. The material of claim 12, wherein the fibers comprise silver nanowires.

16. The material of claim 12, wherein the fibers comprise copper nanowires.

17. The material of claim 12, wherein the fibers comprise a high thermal conductivity metal alloy.

18. The material of claim 12, wherein the sheet has first and second surfaces, and each nano-scale fiber has respective first and second ends, the fibers being oriented such that a substantial fraction of the fibers have their respective first ends at the first surface and their second ends at the second surface, so that the fibers directly conduct heat between the first and second surfaces.

19. The material of claim 18, further comprising at least one capping layer having a direct thermal interface with at least one of the first ends and the second ends of the fibers.

20. The material of claim 12, wherein the stabilizing material comprises 1-10nm diameter nanoparticles between the fibers.

21. The material of claim 12, wherein the stabilizing material comprises a polymerizable material and a concentration of nanoparticles of 20-60% by volume.

22. The material of claim 12, wherein the stabilizing material comprises metallic micro- or nano- particles.

23. The material of claim 12, wherein the stabilizing material comprises nano- or micro- particles having a thermal conductivity greater than a bulk material of the stabilizing material.

24. The material of claim 12, further comprising at least one capping layer disposed on a surface of the sheet, at least a portion of the fibers terminating within the capping layer.

25. The material of claim 24, wherein the capping layer comprises metallic microparticles which are at least 1micron in size.

26. The material of claim 12, wherein the thermal interface material is configured to reduce mechanical stresses that arise between devices coupled by the thermal interface material as compared to a direct bonding of surfaces of the devices.

27. The material of claim 26, wherein the thermal interface material is configured to reduce a stress between devices cause by at least one of differences in coefficient of thermal expansion, or differences in temperature.

28. The material of claim 12, wherein the thermal interface material comprises areas having low modulus of elasticity, whereby stresses in an assembly composed of a device, a heat sink, and the thermal interface material disposed between respective surfaces of the device and the heat sink, are reduced.

29. The material of claim 12, wherein:
the stabilization material has a lower modulus of elasticity than the fibers; and
at least one of fibers and stabilization material are configured to be selectively disposed at defined hot spots on a device to be cooled, with at least some gaps elsewhere, whereby stresses are reduced.

* * * * *